(12) United States Patent
Zhang et al.

(10) Patent No.: US 12,182,353 B2
(45) Date of Patent: Dec. 31, 2024

(54) DISPLAY PANEL AND DISPLAY APPARATUS HAVING A TOUCH FUNCTIONAL LAYER

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Shun Zhang, Beijing (CN); Yuanqi Zhang, Beijing (CN); Ping Wen, Beijing (CN); Yu Wang, Beijing (CN); Yi Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/797,486

(22) PCT Filed: Jul. 21, 2021

(86) PCT No.: PCT/CN2021/107497
§ 371 (c)(1),
(2) Date: Aug. 4, 2022

(87) PCT Pub. No.: WO2023/000188
PCT Pub. Date: Jan. 26, 2023

(65) Prior Publication Data
US 2024/0201810 A1   Jun. 20, 2024

(51) Int. Cl.
*G09G 3/30* (2006.01)
*G06F 3/041* (2006.01)
(Continued)

(52) U.S. Cl.
CPC ........ *G06F 3/04164* (2019.05); *G06F 3/0443* (2019.05); *G06F 3/0446* (2019.05);
(Continued)

(58) Field of Classification Search
CPC .. G06F 3/04164; G06F 3/0443; G06F 3/0446; G06F 2203/04111; H10K 59/40; H10K 2102/311
See application file for complete search history.

(56) References Cited

U.S. PATENT DOCUMENTS

| 2015/0382446 A1 | 12/2015 | Kwon et al. |
| 2017/0060310 A1 | 3/2017 | Gwon et al. |

(Continued)

FOREIGN PATENT DOCUMENTS

| CN | 203405800 U | 1/2014 |
| CN | 103558936 A | 2/2014 |

(Continued)

*Primary Examiner* — Sanghyuk Park
(74) *Attorney, Agent, or Firm* — Dority & Manning, P.A.

(57) ABSTRACT

A display panel has a display region, and a bending region and a bonding region. The display panel includes a display substrate and a touch functional layer disposed on the display substrate. The touch functional layer includes touch units disposed in the display region, at least portion of each of touch lines and compensation lines. Each touch unit is electrically connected to at least one touch line. The touch lines includes at least one first touch line and at least one second touch line, and a resistance of the at least one first touch line is greater than a resistance of the at least one second touch line. At least part compensation lines of the compensation lines are disposed on the side of the bending region away from the display region. A second touch line is electrically connected to at least one compensation line.

20 Claims, 16 Drawing Sheets

(51) Int. Cl.
*G06F 3/044* (2006.01)
*G09G 3/36* (2006.01)
*H10K 59/40* (2023.01)
*H10K 102/00* (2023.01)

(52) U.S. Cl.
CPC .... *H10K 59/40* (2023.02); *G06F 2203/04111* (2013.01); *H10K 2102/311* (2023.02)

(56) References Cited

U.S. PATENT DOCUMENTS

| | | | |
|---|---|---|---|
| 2018/0143720 | A1 | 5/2018 | Kim et al. |
| 2018/0197924 | A1 | 7/2018 | Tada et al. |
| 2019/0074332 | A1* | 3/2019 | Kim ................. H10K 59/00 |
| 2020/0167037 | A1 | 5/2020 | Lee et al. |
| 2020/0388230 | A1* | 12/2020 | Lee ................. G09G 3/3275 |
| 2021/0200407 | A1* | 7/2021 | Jang ................. G06F 3/04164 |
| 2022/0011917 | A1 | 1/2022 | Zhang et al. |

FOREIGN PATENT DOCUMENTS

| | | |
|---|---|---|
| CN | 106933398 A | 7/2017 |
| CN | 109933234 A | 6/2019 |
| CN | 111522463 A | 8/2020 |
| CN | 112711349 A | 4/2021 |
| EP | 2735948 A1 | 5/2014 |

* cited by examiner

DISPLAY PANEL AND DISPLAY APPARATUS HAVING A TOUCH FUNCTIONAL LAYER

CROSS-REFERENCE TO RELATED APPLICATION

The present application is a national phase entry under 35 USC 371 of International Patent Application No. PCT/CN2021/107497, filed on Jul. 21, 2021, which is incorporated herein by reference in its entirety.

TECHNICAL FIELD

The present disclosure relates to the field of display technologies, and in particular, to a display panel and a display apparatus.

BACKGROUND

The technology of On Cell refers to a technology of providing a touch functional layer on the display side of the display panel. For example, the touch functional layer may be formed directly on a thin film encapsulation (TFE) layer of the display panel by photolithographic process. The touch functional layer includes touch units and peripheral lines; each touch unit is electrically connected to at least one peripheral line, so that a touch sensor signal is transmitted to the touch unit through the peripheral line.

SUMMARY

In an aspect, a display panel is provided. The display panel has a display region, and a bending region and a bonding region that are located on a side of the display region and sequentially away from the display region.

The display panel includes a display substrate and a touch functional layer disposed on the display substrate. The touch functional layer includes a plurality of touch units, at least portion of each of a plurality of touch lines and a plurality of compensating lines. The plurality of touch units are disposed in the display region. Each touch unit is electrically connected to at least one touch line. The plurality of touch lines extend from the display region through the bending region to a side of the bending region away from the display region. The plurality of touch lines include at least one first touch line and at least one second touch line, and a resistance of the at least one first touch line is greater than a resistance of the at least one second touch line. At least part compensation lines of the plurality of compensation lines are disposed on the side of the bending region away from the display region. A second touch line is electrically connected to at least one compensating line.

In some embodiments, the display panel further has a first fanout region located between the display region and the bending region, and a second fanout region located between the bending region and the bonding region; an area of the second fanout region being greater than an area of the first fanout region. The compensation lines disposed on the side of the bending region away from the display region are each bent at least once in the second fanout region, and are assembled to the bonding region.

In some embodiments, the plurality of touch lines include at least one first touch line group and at least one second touch line group. An average resistance of one or more touch lines of the at least one first touch line group is greater than an average resistance of one or more touch lines of the at least one second touch line group. The compensation lines include at least one compensation line group that is in one-to-one correspondence with the at least one second touch line group. At least one compensation line of each compensation line group is electrically connected to at least one touch line of a respective second touch line group.

A touch line of the at least one second touch line group and a compensation line electrically connected thereto provide a compensation touch line. An average resistance of one or more compensation touch lines in the at least one second touch line group and the respective compensation line group is substantially equal to the average resistance of one or more touch lines of one or more of the at least one first touch line group.

In some embodiments, a resistance of the compensation touch line is approximately equal to a resistance of at least one touch line of the at least one first touch line group.

In some embodiments, a resistance of each compensation touch line in the at least one second touch line group and the respective compensation line group is approximately the same.

In some embodiments, an average length of the one or more touch lines of the at least one second touch line group is less than an average length of the one or more touch lines of the at least one first touch line group.

In some embodiments, the display panel further has a first fanout region located between the display region and the bending region, and a second fanout region located between the bending region and the bonding region.

The display substrate includes a substrate and a first conductive layer disposed on the substrate. The first conductive layer includes a first power supply voltage line extending from the first fanout region to the bonding region sequentially through the bending region and the second fanout region.

The plurality of touch lines each include a touch connection segment located in the first fanout region and the second fanout region. An orthogonal projection of the touch connection segment on the substrate at least partially overlaps with an orthogonal projection of the first power supply voltage line on the substrate. Orthogonal projections of the plurality of compensation lines on the substrate at least partially overlap with the orthogonal projection of the first power supply voltage line on the substrate.

In some embodiments, orthogonal projections of one or more compensation lines on the substrate are within the orthogonal projection of the first power supply voltage line on the substrate. And/or, the first conductive layer further includes a second power supply voltage line, the second power supply voltage line extends from the first fanout region to the bonding region sequentially through the bending region and the second fanout region. Orthogonal projections of another one or more compensation lines on the substrate partially overlap with the orthogonal projection of the first power supply voltage line on the substrate and partially overlap with an orthogonal projection of the second power supply voltage line on the substrate.

In some embodiments, the first power supply voltage line includes a first connection portion located in the first fanout region, the bending region and the second fanout region, and the first connection portion is located on a first-side of a center line extending in a second direction of the display panel. The second direction is substantially perpendicular to a boundary line between the first fanout region and the display region. Touch lines to which touch connection segments, whose orthogonal projections on the substrate located within the orthogonal projection of the first connection portion on the substrate, belong include at least one first-side first touch line group and N first-side second touch line groups; N is a number greater than or equal to 2.

From a first first-side second touch line group to an N-th first-side second touch line group, average resistances of all touch lines of each first-side second touch line group are sequentially reduced. The plurality of compensation lines include N compensation line groups corresponding to the N first-side second touch line groups, an i-th first-side second touch line group is electrically connected to an i-th compensation line group, i is a number in a range of 1 to N, inclusive; average resistances of all compensation lines of each compensation line group from a first compensation line group to an N-th compensation line group are sequentially increased.

In some embodiments, the at least one first-side first touch line group and the N first-side second touch line groups are sequentially disposed in a first direction, and the N first-side second touch line groups are closer to the center line than the at least one first-side first touch line group. The first direction is substantially parallel to the boundary line between the first fanout region and the display region. The N compensation line groups are all located on a side of the at least one first-side first touch line group proximate to the center line.

In some embodiments, the first conductive layer further includes a second power supply voltage line, and the second power supply voltage line is located on a side of the first connection portion proximate to the center line.

The N compensation line groups include at least one first target compensation line group and at least one second target compensation line group. An orthogonal projection of the first target compensation line group on the substrate is located within the orthogonal projection of the first connection portion on the substrate. An orthogonal projection of the second target compensation line group on the substrate partially overlaps with the orthogonal projection of the first connection portion on the substrate, and partially overlaps with the orthogonal projection of the second power supply voltage line on the substrate.

In some embodiments, a first-side second touch line group corresponding to a second target compensation line group is located on a side of a first-side second touch line group corresponding to a first target compensation line group proximate to the center line extending in the second direction of the display panel.

In some embodiments, the plurality of touch units include first touch units. Each first touch unit extends in a first direction, and the first touch units are arranged side by side in the second direction. The first direction is substantially parallel to a boundary line between the first fanout region and the display region.

The first touch units are divided into a plurality of groups of first touch units, each group of first touch units includes one or more first touch units adjacent in the second direction. The plurality of groups of first touch units are in one-to-one correspondence with the at least one first-side first touch line group and the N first-side second touch line groups. At least one touch line of each first-side first touch line group and at least one touch line of each first-side second touch line group are respectively electrically connected to at least one first touch unit in a respective group of first touch units.

In the second direction, at least one group of first touch units corresponding to the at least one first-side first touch line group, and N groups of first touch units corresponding to from the first first-side second touch line group to the N-th first-side second touch line group are sequentially approach to the first fanout region.

In some embodiments, the first power supply voltage line includes a second connection portion located in the first fanout region, the bending region and the second fanout region. The second connection portion is located on a second-side of a center line extending in a second direction of the display panel.

Touch lines to which touch connection segments, whose orthogonal projections on the substrate located within an orthogonal projection of the second connection portion on the substrate, belong include at least one second-side first touch line group and at least one second-side second touch line group sequentially disposed in a first direction, and the at least one second-side first touch line group is closer to the center line than the at least one second-side second touch line group. The first direction is substantially parallel to a boundary line between the first fanout region and the display region, and the second direction is substantially perpendicular to the first direction.

The plurality of compensation lines include at least one compensation line group corresponding to the at least one second-side second touch line group, an orthogonal projection of the at least one compensation line group on the substrate is within the orthogonal projection of the second connection portion on the substrate.

In some embodiments, the plurality of touch units include second touch units; each second touch unit extends in the second direction, and the second touch units are arranged side by side in the first direction.

The plurality of second touch units are divided into a plurality of groups of second touch units, each group includes one or more second touch units adjacent in the first direction, and the plurality of groups of second touch units are in one-to-one correspondence with the at least one second-side first touch line group and the at least one second-side second touch line group. At least one touch line of each second-side first touch line group and at least one touch line of each second-side second touch line group are respectively electrically connected to at least one second touch unit of a respective second touch unit group.

In a direction which is from the center line to the second connection portion in the first direction, at least one second touch unit group corresponding to the at least one second-side first touch line group, and at least one second touch unit group corresponding the at least one second-side second touch line group are sequentially disposed.

In some embodiments, the display panel further has a third peripheral region and a fourth peripheral region on opposite sides of the display region in the second direction, and the first fanout region, the bending region, the second fanout region and the bonding region are located in the fourth peripheral region. Touch lines of the at least one second-side first touch line group and the at least one second-side second touch line group are all located in the fourth peripheral region.

In some embodiments, the display panel further has a first peripheral region and a second peripheral region on opposite sides of the display region in the first direction. The plurality of touch lines further includes a third touch line group. At least one touch line of the third touch line group is electrically connected to at least one second touch unit, and is assembled to the bonding region from the third peripheral region sequentially through the second peripheral region, the first fanout region, the bending region and the second fanout region.

Orthogonal projections of portions, located in the first fanout region and the second fanout region, of the at least one touch line of the third touch line group are located within the orthogonal projection of the first power supply voltage line on the substrate. Part of the third touch line group located in the fourth peripheral region is farther away from the center line than the at least one second-side second touch line group.

In some embodiments, the touch functional layer includes an electrode layer, a first insulating layer and a bridging layer that are stacked on the display substrate. The first insulating layer is located between the electrode layer and the bridging layer, and the bridging layer is located on a side of the electrode layer proximate to or away from the display substrate.

The plurality of touch units include a plurality of first touch units and a plurality of second touch units that are insulated from each other. Each first touch unit extends in a first direction and includes a plurality of first touch electrodes and a plurality of first connection bridges, and two adjacent first touch electrodes are electrically connected to each other through a first connection bridge; the plurality of first touch units are arranged side by side in a second direction.

Each second touch unit extends in the second direction and includes a plurality of second touch electrodes and a plurality of second connection bridges, and two adjacent second touch electrodes are electrically connected to each other through a second connection bridge; the plurality of second touch units are arranged side by side in the first direction.

The first touch electrodes, the first connection bridges and the second touch electrodes are disposed in the electrode layer, and the second connection bridges are disposed in the bridging layer. Or, the first touch electrodes, the second touch electrodes and the second connection bridges are disposed in the electrode layer, and the first connection bridges are disposed in the bridging layer.

In some embodiments, the second touch line located includes a first touch sub-line located in the electrode layer and a second touch sub-line located in the bridging layer, and the first touch sub-line and the second touch sub-line are electrically connected to each other through at least one via hole provided in the first insulating layer.

The compensation line is disposed in the electrode layer, and is directly electrically connected to the first touch sub-line of the second touch line. Or, the compensation line is disposed in the bridging layer, and is directly electrically connected to the second touch sub-line of the second touch line. Or, the compensation line includes a first compensation sub-line disposed in the electrode layer and a second compensation sub-line disposed in the bridging layer, the first compensation sub-line is directly electrically connected to the first touch sub-line of the second touch line, and the second compensation sub-line is directly electrically connected to the second touch sub-line of the second touch line group.

In some embodiments, in a case where the compensating line includes the first compensation sub-line and the second compensation sub-line, the first compensation sub-line and the second compensation sub-line are electrically connected to each other through at least one via hole provided in the first insulating layer disposed between the electrode layer and the bridging layer.

In some embodiments, the compensation line is in a broken line shape and includes a plurality of broken line segments, and at least one broken line segment extends in a first direction or a second direction. The first direction intersects the second direction.

In some embodiments, the compensation line includes a main segment and a connection segment. An end of the main segment is electrically connected to a corresponding touch line, and another end of the main segment after being bent at least once is electrically connected to an end of the connection segment; another end of the connection segment away from the main segment extends to the bonding region. A width of the main segment is less than a width of the corresponding touch line, and/or less than a width of the connection segment.

In some embodiments, the display substrate includes a first conductive layer. Each touch line includes a touch connection segment disposed in the touch functional layer and a transition segment disposed in the first conductive layer. The touch connection segment includes a first touch connection sub-segment disposed in the first fanout region and a second touch connection sub-segment disposed in the second fanout region. The transition segment is disposed in the bending region.

An end of the transition segment is electrically connected to the first touch connection sub-segment through a via hole provided in an insulating layer between the first conductive layer and the touch functional layer, and another end of the transition segment is electrically connected to the second touch connection sub-segment through another via hole provided in the insulating layer between the first conductive layer and the touch functional layer.

In another aspect, a display panel is provided. The display panel has a display region, and a first fanout region, a bending region, a second fanout region and a bonding region located on a side of the display region and sequentially away from the display region; and an area of the second fanout region is greater than an area of the first fanout region.

The display panel includes a display substrate and a touch functional layer. The display substrate includes a first power supply voltage line, and the first power supply voltage line includes a first connection portion and a second connection portion that are both located in the first fanout region, the bending region and the second fanout region; the first connection portion and the second connection portion are respectively located on opposite sides of a center line extending in a second direction of the display panel.

The touch functional layer is disposed on the display substrate, and the touch functional layer includes a plurality of touch units, at least portion of each of a plurality of touch lines and a plurality of compensation lines. The plurality of touch units are disposed in the display region. Each touch unit is electrically connected to at least one touch line. The plurality of touch lines extend from the display region to the second fanout region sequentially through the first fanout region and the bending region. The plurality of touch lines include first touch line groups and second touch line groups, and an average resistance of all touch lines of a first touch line group is greater than an average resistance of all touch lines of a second touch line group. All the touch lines of the first touch line group are assembled to the bonding region. The plurality of compensation lines are each bent at least once in the second fanout region and assembled to the bonding region. The plurality of compensation lines include compensation line groups that are in one-to-one correspondence with the second touch line groups, and at least one compensation line of each compensation line group is electrically connected to at least one touch line of a respective second touch line group.

The first touch line groups and the second touch line groups include one first-side first touch line group, two first-side second touch line groups, one second-side first touch line group and one second-side second touch line group that are sequentially disposed in a direction which is from the first connection portion to the second connection portion in a first direction. Orthogonal projections of the first-side first touch line group and the first-side second touch line groups on the display substrate each overlap with an orthogonal projection of the first connection portion of the first power supply voltage line on the display substrate; and orthogonal projections of the second-side first touch-control line group and the second-side second touch line group on the display substrate each overlap with an orthogonal projection of the second connection portion of the first power supply voltage line on the display substrate. The first direction is substantially parallel to a boundary line between the first fanout region and the display region, and the second direction is substantially perpendicular to the first direction.

In some embodiments, the plurality of touch lines further include a third touch line group, and part of the third touch line group located in the first fanout region, the bending region and the second fanout region is farther away from the center line than the second-side second touch line groups.

In some embodiments, the display panel further includes a plurality of pin groups disposed in the bonding region and including a first pin group, a second pin group, a third pin group, a fourth pin group, a fifth pin group, a sixth pin group and a seventh pin group that are sequentially disposed in a direction from the first connection portion to the second connection portion in the first direction. Each pin group includes at least one pin.

Each touch line of the first-side first touch line group is electrically connected to at least one pin of the first pin group; each compensation line of a compensation line group corresponding to one of the two first-side second touch line groups is electrically connected to at least one pin of the second pin group; each compensation line of a compensation line group corresponding to another of the two first-side second touch line groups is electrically connected to at least one pin of the third pin group; the first power supply voltage line is electrically connected to at least one pin of the fourth pin group; each touch line of the second-side first touch line group is electrically connected to at least one pin of the fifth pin group; each compensation line of a compensation line group corresponding to the second-side second touch line group is electrically connected to at least one pin of the sixth pin group; and each touch line of the third touch line is electrically connected to at least one pin of the seventh pin group.

In yet another aspect, a display apparatus is provided. The display apparatus includes the display panel as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and actual timings of signals to which the embodiments of the present disclosure relate.

DETAILED DESCRIPTION

Figure 1:
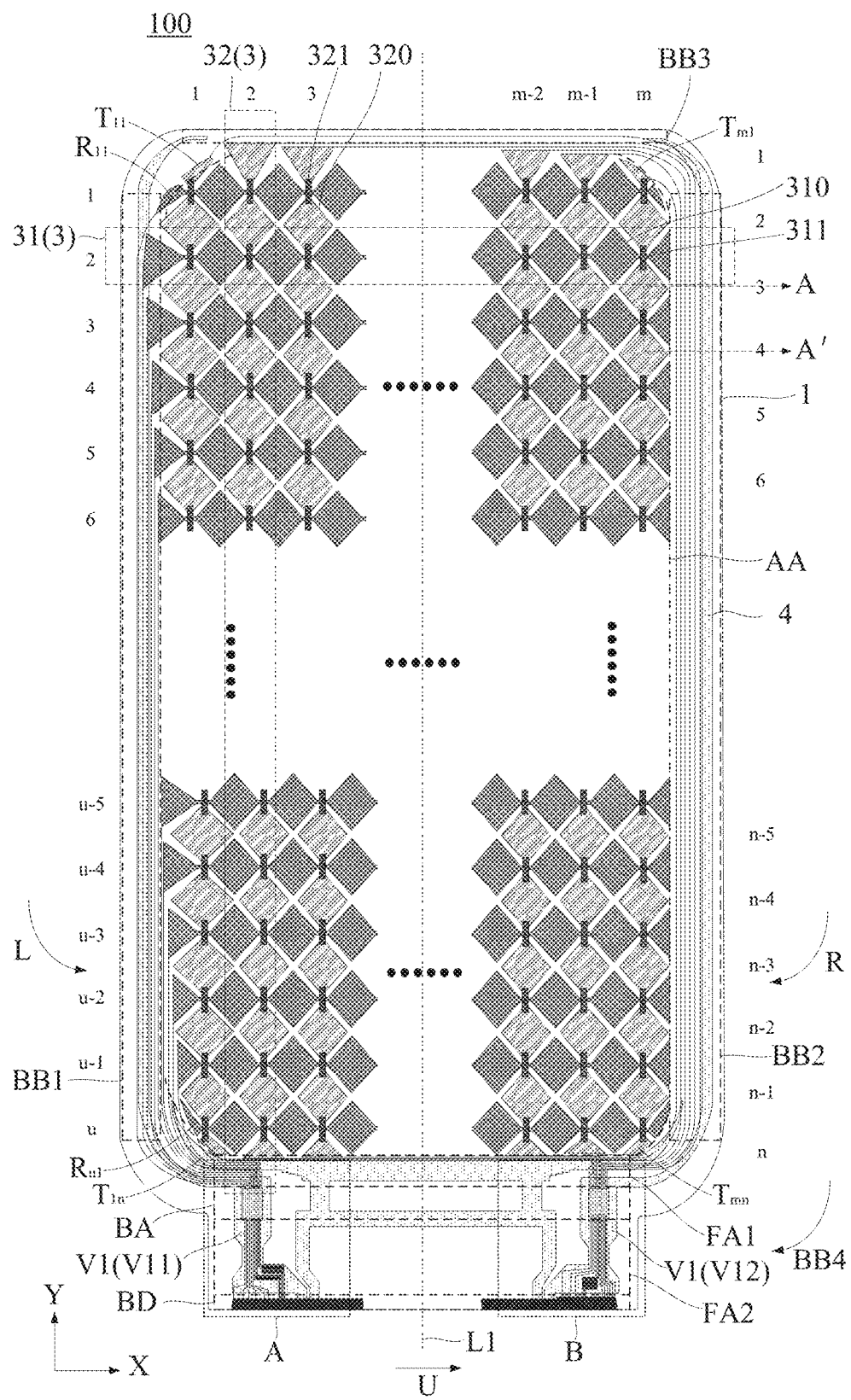
FIG. 1 is a top view of a display panel, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on embodiments in the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of or the plurality of" means two or more unless otherwise specified.

In the description of some embodiments, the term "electrically connected" and its extensions may be used. For example, the term "connected" may be used in the description of some embodiments to indicate that two or more components are directly physical contact or electrical contact with each other.

The phrase "A and/or B" includes the following three combinations: only A, only B, and a combination of A and B.

The use of the phrase "configured to" herein means an open and inclusive expression, which does not exclude devices that are adapted to or configured to perform additional tasks or steps.

In addition, the use of the phase "based on" herein means to be open and inclusive. Since process, step, calculation or other action that is "based on" one or more of the conditions or values may, in practice, have additional conditions or be beyond value.

As used herein, the terms such as "approximately" includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

The term "same layer" refers to a layer structure, formed by forming a film for forming a specific pattern by a same film-forming process, and then formed by a single patterning process by utilizing a same mask. According to different specific patterns, the single patterning process may include several exposure, development or etching processes. The specific patterns of the formed in the layer structure may be continuous or discontinuous, and may also be at different heights or have different thicknesses.

Exemplary embodiments are described herein with reference to sectional views and/or plan views as idealized exemplary drawings. In the accompanying drawings, thickness of layers and sizes of regions are enlarged for clarity. Variations in shapes relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

In the related arts, in a process of arranging and designing peripheral lines of a touch functional layer, a difference in resistances of the peripheral lines is reduced by reducing a difference in lengths of the peripheral lines, so that a difference in voltage drops generated by the peripheral lines while transmitting sensor signals is reduced, and the uniformity of the sensor signals received by touch units is improved; as a result, the accuracy of touch control is improved.

At present, a display panel includes a display region (also named as an active display region) AA, and a fanout region located on a side of the display region, and the fanout region is located in a frame region of the display apparatus. A peripheral line with a relatively short length is bent and routed in a zigzag in the fanout region, so that the length of the peripheral line may be increased; as a result, the resistance of the peripheral line is increased, and a difference in the resistances between the peripheral line with the relatively short length and a the peripheral line with a relatively long length is reduced.

However, that the peripheral lines are bent and routed in a zigzag in the fanout region may occupy a large area of the fanout region, resulting in an increased width of a bezel of the display apparatus, which is not conducive to narrowing the bezel of the display apparatus.

In order to solve the above problems, as shown in FIG. 1, some embodiments of the present disclosure provide a display panel 100. The display panel 100 has a display region AA, and a bending region BA and a bonding region BD located on a side of the display region AA and sequentially away from the display region AA.

It will be understood that, the display panel 100 is bent in the bending region BA, so that a portion of the display panel 100 in a region (which includes the bonding region BD) located on a side of the bending region BA away from the display region AA is folded onto a non-display side of the display panel 100; thus, a region between the display region AA and the bending region BA corresponds to a bezel of the display apparatus.

Figure 22:
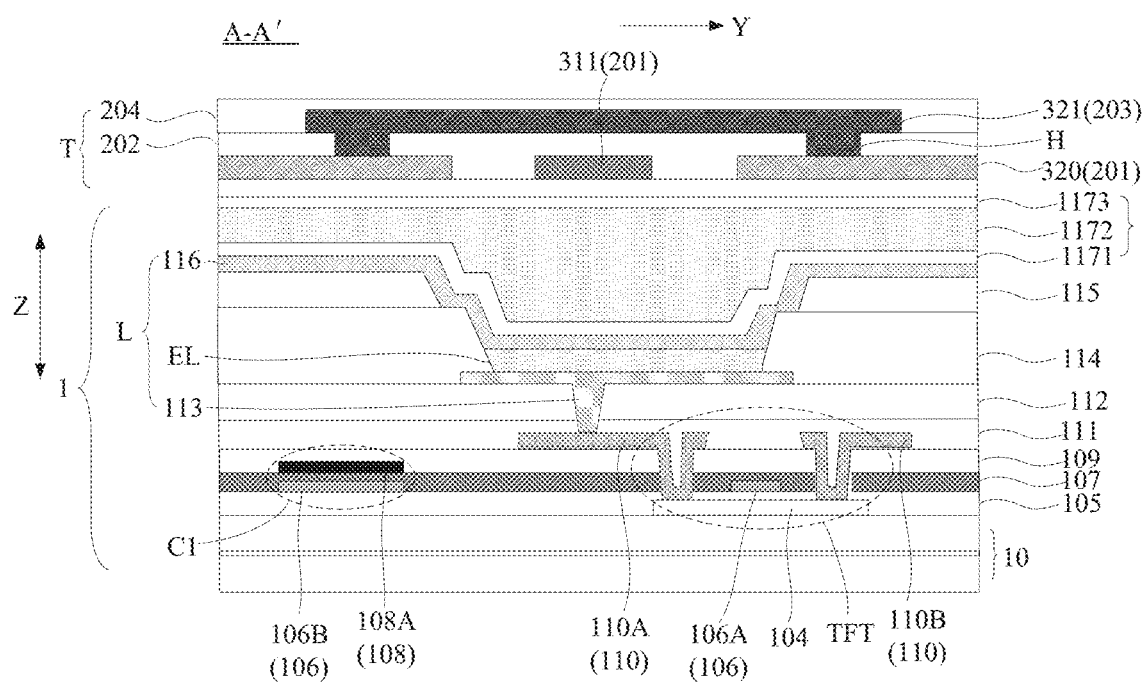
FIG. 22 is a sectional view of the display panel in FIG. 1 taken along the line A-A'.

As shown in FIGS. 1 and 22, the display panel 100 further includes a display substrate 1 and a touch functional layer T disposed on the display substrate 1.

As shown in FIG. 22, the display substrate 1 includes a substrate 10, and a plurality of driving circuits and a plurality of light-emitting devices L that are disposed on the substrate 10. Based on this, the display substrate 1 includes a plurality of sub-pixels, and each sub-pixel includes a pixel driving circuit and a light-emitting device L electrically connected to the pixel drive circuit.

For example, the substrate 10 may be of a multi-layer structure. For example, the substrate 10 may include a first polyimide layer, a buffer layer and a second polyimide layer that are sequentially stacked.

As shown in FIG. 22, the display substrate 1 includes an active layer 104, a first gate insulating layer 105, a first gate conductive layer 106, a second gate insulating layer 107, a second gate conductive layer 108, an interlayer dielectric layer 109, and a source-drain conductive layer 110 that are sequentially stacked on the substrate 10.

The first gate insulating layer 105 insulates the active layer 104 from the first gate conductive layer 106, the second gate insulating layer 107 insulates the first gate conductive layer 106 from the second gate conductive layer 108, and the interlayer dielectric layer 109 insulates the second gate conductive layer 108 from the source-drain conductive layer 110.

As shown in FIG. 22, each pixel driving circuit includes a plurality of thin film transistors TFT and at least one capacitor C1, and FIG. 22 shows one of the thin film transistors TFT and one of the at least one capacitor C1.

The thin film transistors TFT each include a portion of the active layer 104, a portion of the first gate insulating layer 105, a gate 106A disposed in the first gate conductive layer 106, a portion of the second gate insulating layer 107, a portion of the interlayer dielectric layer 109, and a source 110A and a drain 110B that both disposed in the source-drain conductive layer 110.

For example, the active layer 104 may be disposed on the substrate 10. The first gate insulating layer 105 covers the substrate 10 and the active layer 104. The gate 106A is disposed on a side of the first gate insulating layer 105 away from the substrate 10. The second gate insulating layer 107 covers the gate 106A and the first gate insulating layer 105. The interlayer dielectric layer 109 covers the second gate insulating layer 107. The source 110A and the drain 110B are disposed on a side of the interlayer dielectric layer 109 away from the substrate 10. The source 110A and the drain 110B may be respectively electrically connected to the active layer 104 through via holes penetrating the interlayer dielectric layer 109, the second gate insulating layer 107 and the first gate insulating layer 105.

It will be understood that, the gate 106A is disposed on the side of the active layer 104 away from the substrate 10, that is, the gate 106A is located above the active layer 104; in this case, the thin film transistor TFT is a top-gate thin film transistor. In other embodiments, the gate 106A may be disposed on a side of the active layer 104 proximate to the substrate 10, that is, the gate 106A is located below the active layer 104; in this case, the thin film transistor TFT is a bottom-gate thin film transistor.

The capacitor C1 may include a first plate 106B disposed in the first gate conductive layer 106, and a second plate 108A disposed in the second gate conductive layer 108. The first plate 106B is disposed in a same layer as the gate 106A, and the second plate 108A is disposed between the second gate insulating layer 107 and the interlayer dielectric layer 109, and is disposed opposite to the first plate 106B.

As shown in FIG. 22, the display substrate 1 further includes a passivation layer 111 and a planarization layer 112 that are sequentially stacked on a side of source-drain conductive layer 110 away from the substrate 10. The passivation layer 111 and the planarization layer 112 covers the source 110A and the drain 110B, so as to protect the source 110A and the drain 110B.

In addition, the above-mentioned layers where the pixel driving circuits are located further include gate lines, data lines, voltage drain drain (VDD) lines, voltage source source (VSS) lines, and the like. Each pixel driving circuit is electrically connected to a gate line, a data line and a VDD line, so as to transmit a driving signal to the light-emitting device L. As shown in FIG. 1, the VDD lines may be a plurality of lines extending in a second direction Y in the display region AA, and the VSS lines may be disposed in a peripheral region around the display region AA. The light-emitting device L is electrically connected to the VSS line.

As shown in FIG. 1, the second direction Y is substantially perpendicular to a boundary line between a first fanout region FA1 and the display region AA. For example, the second direction Y is consistent with a column direction of the plurality of the sub-pixels arranged in an array in the display substrate 1.

The above-mentioned layers where the driving circuits are located further include a gate driving circuit, and clock signal lines, start vertical (STV) lines, high gate voltage (VGH) lines, and low gate voltage (VGL) lines that are electrically connected to the gate driving circuit.

As shown in FIG. 22, the display substrate 1 further includes a first electrode 113 disposed on a side of the planarization layer 112 away from the substrate 10, and the first electrode 113 is electrically connected to the source 110A through a via hole penetrating the planarization layer 112 and the passivation layer 111.

As shown in FIG. 22, the display substrate 1 further includes a pixel definition layer 114 disposed on the side of the planarization layer 112 away from the substrate 10. The pixel definition layer 114 has a plurality of openings, each opening exposes at least part of the first electrode 113, and each opening is located in a sub-pixel.

As shown in FIG. 22, the light-emitting device L includes the first electrode 113, a light-emitting functional layer EL and a second electrode 116.

The light-emitting functional layer EL is located in the opening of the pixel definition layer 114 and formed on the first electrode 113. The light-emitting functional layer EL may include a small molecular organic material or a polymer molecular organic material, which may be a fluorescent light-emitting material or a phosphorescent light-emitting material that being capable of emitting red light, green light, blue light or white light, etc. In addition, according to different actual needs, in different examples, the light-emitting functional layer EL may further includes one or more of an electron transporting layer (ETL), an electron injection layer (EIL), a hole transporting layer (HTL), and a hole injection layer (HIL).

The second electrode 116 covers the light-emitting functional layer EL. It will be noted that, second electrodes 116 of the light-emitting devices L in all sub-pixels are connected to one another to form a planar electrode as a whole layer to serve as a common electrode of each of light-emitting devices L.

For example, the first electrode 113 may be an anode, and the second electrode 116 may be a cathode.

The first electrode 113 of the light-emitting device L is electrically connected to the pixel driving circuit, so as to receive the driving signal from the pixel driving circuit, and an edge of the second electrode 116 extends to the peripheral region and is electrically connected to the VSS line to receive a VSS signal from the VSS line, so that an electric field is generated between the first electrode 113 and the second electrode 116, so as to excite the light-emitting functional layer EL to emit light.

As shown in FIG. 22, the display substrate 1 further includes a supporting portion 115 disposed on a side of the pixel definition layer 114 away from the substrate 10, and the support portion 115 may play a role of supporting and protecting layers located thereunder.

As shown in FIG. 22, the display substrate 20 further includes an encapsulation layer 117 disposed on a side of the second electrode 116 away from the substrate 10. The encapsulation layer 117 may include a first inorganic encapsulation sub-layer 1171, an organic encapsulation sub-layer 1172 and a second inorganic encapsulation sub-layer 1173 that are sequentially stacked. The encapsulation layer 117 is used for encapsulation of the display substrate 1 to prevent moisture and oxygen from entering and eroding the light-emitting devices L.

In the technology of On Cell, the touch functional layer T is directly disposed on the encapsulation layer 117 of the display substrate 1 by a process of flexible multi-layer on cell (FMLOC) technology. The working principle of the FMLOC technology may be based on a mutual capacitance detection, which generally adopts two layers of metal to form touch driving electrodes (transmitting electrode, TX) and touch sensing electrodes (receiving electrode, RX). In a case where a finger touches the display apparatus, the finger will take away electric charges from a touch unit, and a touch control integrated circuit (IC) recognizes a touch position of the finger by detecting a change in a mutual capacitance value between the TX and the RX, so as to realize touch function of the display apparatus.

The following embodiments of the present disclosure will be described by considering an example in which the display panel 100 adopts the FMLOC technology.

As shown in FIG. 1, in the display panel 100, the touch functional layer T includes a plurality of touch units 3 disposed in the display region AA for realizing the touch function of the display apparatus.

The plurality of touch units 3 of the touch functional layer T include a plurality of first touch units 31 (RX) and a plurality of second touch units 32 (TX). Each first touch unit 31 extends in a first direction X, and the plurality of first touch units 31 are arranged side by side in the second direction Y. Each second touch unit 32 extends in the second direction Y, and the plurality of second touch units 32 are arranged side by side in the first direction X. The plurality of first touch units 31 are insulated from the plurality of second touch units 32. The touch control IC recognizes a touch action of the finger by detecting the change in mutual capacitance values between the first touch unit 31 and the second touch unit 32, so as to realize the touch function of the display apparatus.

The first direction X is substantially parallel to the boundary line between the first fanout region FA1 and the display region AA. For example, the first direction X is consistent with a row direction of the plurality of sub-pixels arranged in an array in the display substrate 1.

As shown in FIG. 1, the touch factional layer T further includes at least portion of each of a plurality of touch lines 4, and each touch unit 3 is electrically connected to at least one touch line 4. The touch line 4 is configured to transmit a voltage signal (a sensor signal) to the touch unit 3 electrically connected thereto.

For example, each touch unit 3 is electrically connected to a single touch trace 4, and each touch line 4 transmits a voltage signal to the touch unit 3 electrically connected thereto.

Figure 2:
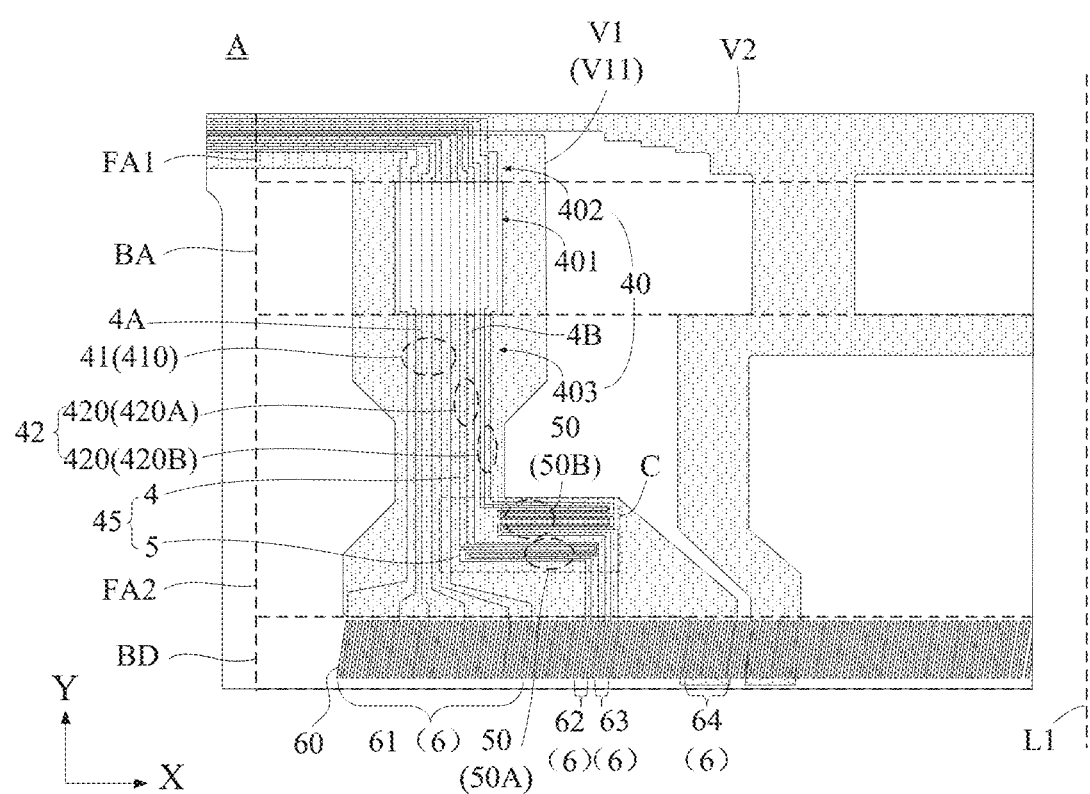
FIG. 2 is a partial enlargement view of the region A of the display panel in FIG. 1.

As shown in FIG. 1, the plurality touch lines 4 extend from the display region AA through the bending region BA to a side of the bending region BA away from the display region AA. As shown in FIG. 2, the plurality of touch lines 4 include at least one first touch line 4A and at least one second touch line 4B, and a resistance of the at least one first touch line 4A is greater than a resistance of the at least one second touch line 4B.

It will be noted that, as shown in FIG. 2, the first touch line(s) 4A extend to the bonding region BD, and the second touch line(s) 4B do not extend to the bonding region BD.

For example, the plurality of touch lines 4 include one first touch line 4A and one second touch line 4B, and a resistance of the first touch line 4A is greater than a resistance of the second touch line 4B.

Figure 4:
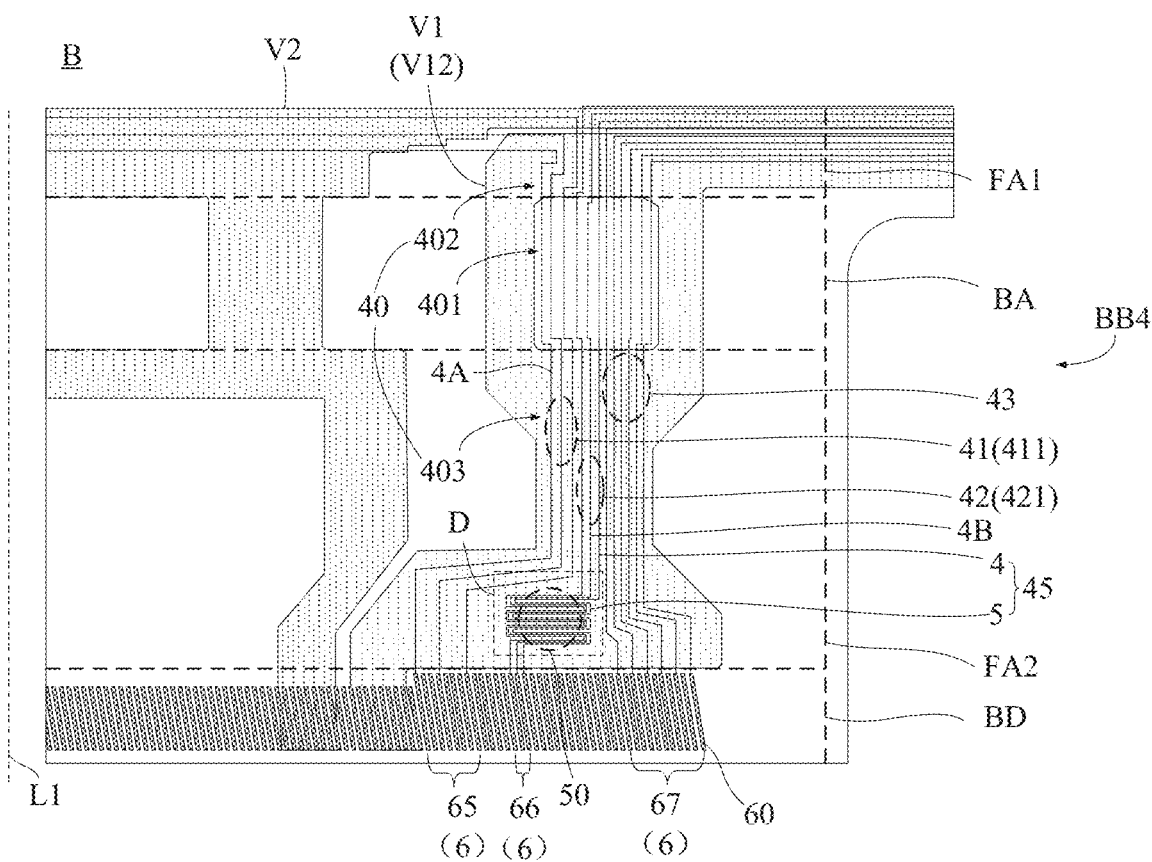
FIG. 4 is a partial enlargement view of the region B of the display panel in FIG. 1.

For example, as shown in FIGS. 2 and 4, the plurality of touch lines 4 include first touch lines 4A and second touch lines 4B. A resistance of each first touch line 4A is greater than a resistance of each second touch line 4B.

As shown in FIGS. 2 and 4, the touch functional layer T further includes a plurality of compensation lines 5, and at least part of compensation lines 5 in the plurality of compensation lines 5 are disposed on the side of the bending region BA away from the display region AA. The second touch line 4B is electrically connected to at least one compensation line 5 to compensate the resistance of the second touch line 4B, so as to reduce a difference between the resistance of the second touch line 4B with the compensation line connected thereto and the resistance of the first touch line 4A.

For example, the plurality of compensation lines 5 are all disposed on the side of the bending region BA away from the display region AA. Each second touch line 4B is electrically connected to a single compensation line 5.

Figure 19:
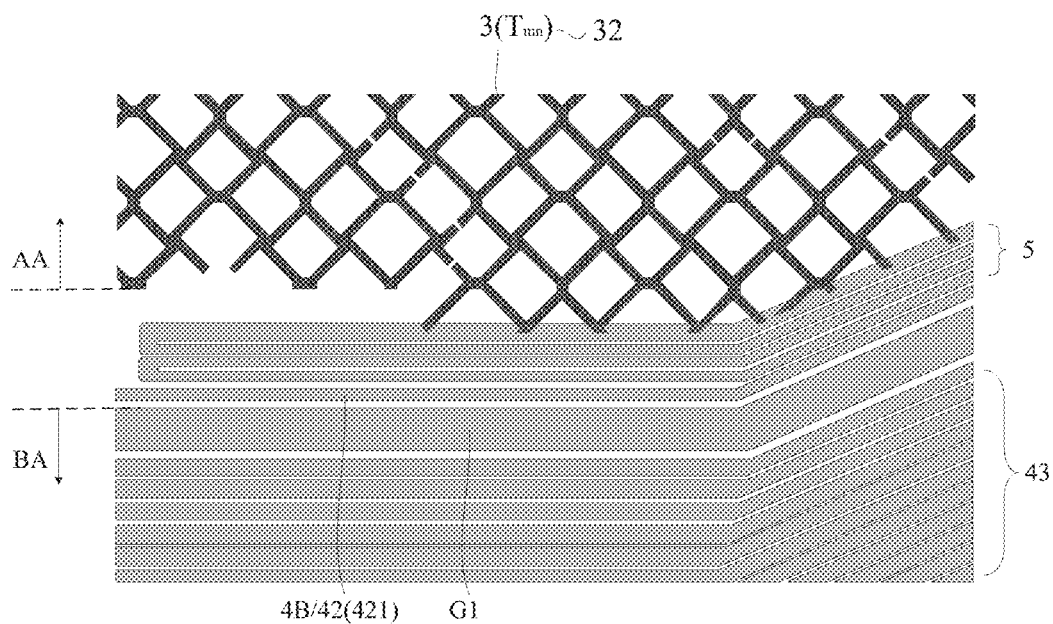

For example, a part of the compensation lines 5 in the plurality of compensation lines 5 are disposed on the side of the bending region BA away from the display region AA, referring to FIG. 19, the other part of the compensation lines 5 in the plurality of compensation lines 5 may be disposed in a region between the display region AA and bending region BA. It will be understood that, with reference to FIGS. 1 and 19, a length of the touch line 4 (the second touch line 4B) electrically connected to a touch electrode $T_{nm}$ located at a lower right corner of the display panel 100 is relatively short, therefore, two ends of the touch line 4 are respectively electrically connected to the compensation line 5 disposed between the display region AA and the bending region BA, and the compensation line 5 disposed on the side of the bending region BA away from the display region AA. That is, a second touch line 4B is electrically connected to two compensation lines 5, so as to compensate the resistance of the second touch line 4B. In some other examples, each second touch line 4B may be electrically connected to one compensation line 5. For example, each second touch line 4B is electrically connected to the compensation line 5 disposed between the display region AA and the bending region BA. For another example, each second touch line 4B is electrically connected to the compensation line 5 disposed on the side of the bending region BA away from the display region AA.

In the above-mentioned embodiments of the present disclosure, the resistance of the first touch line 4A is greater than the resistance of the second touch line 4B; therefore, by electrically connecting the compensation line(s) 5 to the second touch line 4B, the resistance of the second touch line 4B with the compensation line(s) 5 is increased, so that the difference between the resistance of the second touch line 4B with the compensation line(s) 5 and the resistance of the first touch line 4A is reduced. As a result, a difference between a voltage drop (IR-Drop) generated by the second touch line 4B with the compensation line(s) 5 transmitting the voltage signal and a voltage drop generated by the first touch line 4A transmitting the voltage signal is reduced. In a case where each touch line 4 receives a same voltage signal, it is beneficial to improve uniformity of voltage signals received by the touch units 3 to which all touch lines 4 are electrically connected.

In addition, the display panel 100 is bent in the bending region BA, so that a portion of the display panel 100 in the region (which includes the bonding region BD) located on the side of the bending region BA away from the display region AA is folded onto the non-display side of the display panel 100, thus the region between the display area AA and the bending area BA corresponds to a bezel of the display apparatus, and the region located on the side of the bending region BA away from the display region AA is non-correspondence to a bezel of the display apparatus.

In some embodiments, as shown in FIGS. 1, 2 and 4, the display panel 100 further has a first fanout region FA1 located between the display region AA and the bending region BA, and a second fanout region FA2 located between the bending region BA and the bonding region BD. An area of the second fanout region FA2 is greater than an area of the first fanout region FA1.

It will be understood that, by setting the area of the second fanout region FA2 to be greater than the area of the first fanout region FA1, it is beneficial to reduce a width of the bezel of the display apparatus corresponding to the first fanout region FA1, so that it is beneficial to narrow the frame of the display apparatus.

As shown in FIGS. 2 and 4, the compensation lines 5 disposed on the side of the bending region BA away from the display region AA are each bent at least once in the second fanout region FA2 and assembled to the bonding region BD.

It will be understood that the compensation lines 5 are each bent at least once in the second fanout region FA2, so that the compensation lines 5 are bent in a limited space, and the trace length of each of the compensation lines 5 may be increased, and in turn, the resistances of the compensation lines 5 are increased.

In addition, since the area of the second fanout region FA2 is greater than the area of the first fanout region FA1, the second fanout region FA2 may provide more space for bending and routing of the compensation lines 5 than the first fanout region FA1, which is beneficial to increase the trace length of each of the compensation lines 5, so that compensation values for the resistances of the second touch lines 4B are increased.

For example, the compensation lines 5 are each bent for a plurality of times in the second fanout region FA2 and assembled to the bonding region BD, so that the trace lengths of the compensation lines 5 may be increased.

In some embodiments, as shown in FIGS. 2 and 4, the plurality of touch lines 4 include at least one first touch line group 41 and at least one second touch line group 42. An average resistance of touch line(s) 4 of the at least one first touch line group 41 is greater than an average resistance of touch line(s) 4 of the at least one second touch line groups 42.

As shown in FIGS. 2 and 4, the plurality of compensation lines 5 include at least one compensation line group 50 that is in one-to-one correspondence with the at least one second touch line group 42, and at least one compensation line 5 of each compensation line group 50 is electrically connected to at least one touch line 4 of the respective second touch line group 42.

As shown in FIGS. 2 and 4, a touch line 4 of the at least one second touch line group 42 and a compensation line 5 electrically connected thereto provide a compensation touch line 45. An average resistance of all compensation touch lines 45 in the second touch line group(s) 42 and the respective compensation line group(s) 50 is approximately equal to the average resistance of all touch lines 4 of the at least one first touch line group 41.

It will be noted that the first touch line group 41 may include one touch line 4 or a plurality of touch lines 4, the second touch line group 42 may include one touch line 4 or a plurality of touch lines 4, and the compensation line group 50 may include one compensation line 5 or a plurality of compensation lines 5. FIGS. 2 and 4 show a case where the first touch line group 41 includes a plurality of touch lines 4, the second touch trace group 42 includes a plurality of touch lines 4, and the compensation line group 50 includes a plurality of compensation lines 5.

It will be understood that, the average resistance of touch line(s) 4 of the at least one first touch line group 41 is greater than the average resistance of touch line(s) 4 of the at least one second touch line group 42; therefore, by electrically connecting at least one compensation line 5 of each compensation line group 50 to at least one touch line 4 of the respective second touch line group 42, the average resistance of compensation touch line(s) 45 in the second touch line group(s) 42 and the respective compensation line group(s) 50 is approximately equal to the average resistance of touch line(s) 4 of the at least one first touch line group 41.

Through the above arrangement, voltage drop(s), generated by the compensation touch line(s) 45 in the second touch line group(s) 42 and the respective compensation line group 50 while transmitting voltage signal(s), are each approximately equal to a voltage drop generated by the touch line(s) 4 of the at least one first touch line group 41 while transmitting voltage signal(s). In a case where each group of touch lines 4 receives a same voltage signal, it is beneficial to improve uniformity of voltage signals received by the touch units 3 electrically connected to all groups of touch lines 4.

For example, the plurality of touch lines 4 include a plurality of first touch line groups 41 and a plurality of second touch line groups 42. An average resistance of touch line(s) 4 of each first touch line group 41 is greater than an average resistance of touch line(s) 4 of each second touch line group 42.

The plurality of compensation lines 5 include a plurality of compensation line groups 50 that are in one-to-one correspondence with the plurality of second touch line groups 42, and each compensation line 5 of each compensation line group 50 is electrically connected to each touch line 4 of the respective second touch line group 42.

An average resistance of all compensation touch lines 45 in the second touch line groups 42 and the respective compensation line groups 50 is approximately equal to an average resistance of touch line(s) 4 of a first touch line group 41.

In some embodiments, a resistance of a compensation touch line 45 is approximately equal to a resistance of at least one touch line 4 of the at least one first touch line group 41.

It will be understood that, a resistance of each touch line 4 of the second touch line group(s) 42 is less than a resistance of the at least one touch line 4 of the at least one first touch line group 41; therefore, by electrically connecting a compensation line 5 of each compensation line group 50 to a touch line 4 of a respective second touch line group 42, a resistance of each compensation touch line 45 in the second touch line group(s) 42 and the respective compensation line group(s) 50 is approximately equal to the resistance of the at least one touch line 4 of the at least one first touch line group 41.

For example, the resistance of the compensation touch line 45 is approximately equal to each of resistances of the plurality of touch lines 4 of a single first touch line group 41.

Through the above arrangement, a voltage drop, generated by the compensation touch line 45 in the second touch trace group 42 and the respective compensation line group 50 while transmitting the voltage signal, is approximately equal to the voltage drop generated by the at least one the touch line 4 of the at least one first touch line group 41 while transmitting the voltage signal. In a case where the compensation touch line 45 and the touch lines 4 of the first touch line group 41 receive a same voltage signal, it is beneficial to improve uniformity of voltage signals received by touch units 3 to which the compensation touch line 45 and the touch lines 4 are electrically connected respectively.

In some embodiments, in the second touch line group(s) 42 and the respective compensation line group(s) 50, a resistance of each compensation touch line 45 is approximately the same.

It will be understood that, in a case where the second touch line group 42 includes touch lines 4 and the compensation line group 50 includes compensation lines 5, a trace length of each touch line 4 in the second touch line group 42 are not the same, so that the resistance of each touch line 4 in the second touch line group 42 is not the same; each touch line 4 is electrically connected to a respective compensation line 5 to compensate the resistance of each touch line 4, so that the resistances of each compensation touch line 45 in the second touch line group 42 and the respective compensation line group 50 is approximately the same.

Through the above arrangement, a voltage drop generated by each compensation touch line 45 while transmitting the voltage signal is approximately the same, and in a case where each compensation touch line 45 receives a same voltage signal, it is beneficial to improve uniformity of voltage signals received by touch units 3 electrically connected to all the compensation touch lines 45.

In some embodiments, as shown in FIGS. 2 and 4, an average length of all touch lines 4 of the second touch line group 42 is less than an average length of all touch lines 4 of at least one first touch line group 41.

It will be understood that, in a case where the first touch line group 41 includes one touch line 4 and the second touch line group 42 includes one touch line 4, a length of the touch line 4 of the second touch line group 42 is less than a length of the touch line 4 of the first touch line group 41.

Figure 23:
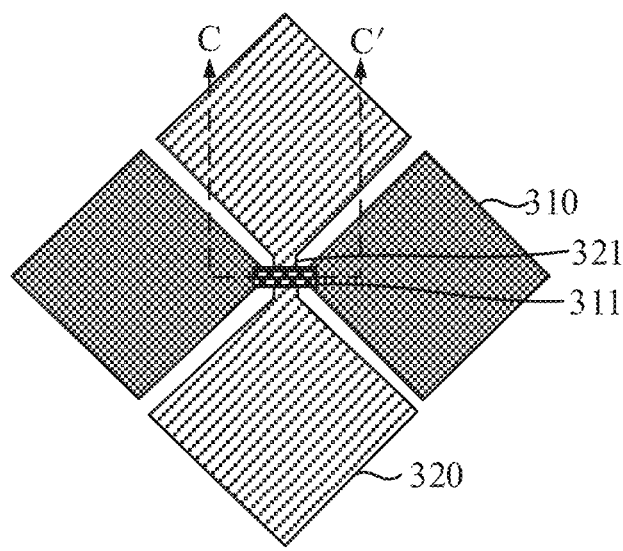
FIG. 23 is a connection diagram of touch electrodes of a display panel, in accordance with some embodiments.

As shown in FIGS. 1 and 23, the plurality of first touch units 31 include first touch units from a 1st row to a u-th row arranged side by side in the second direction Y, where u is a number greater than or equal to 2 (u≥2). Each first touch unit 31 includes a plurality of first touch electrodes 310 (assuming m first touch electrodes 310 are included, and m is a number greater than or equal to 2 (m≥2)) and a plurality of first connection bridges 311. Two adjacent first touch electrodes 310 are electrically connected to each other through a first connection bridge 311.

Figure 16:
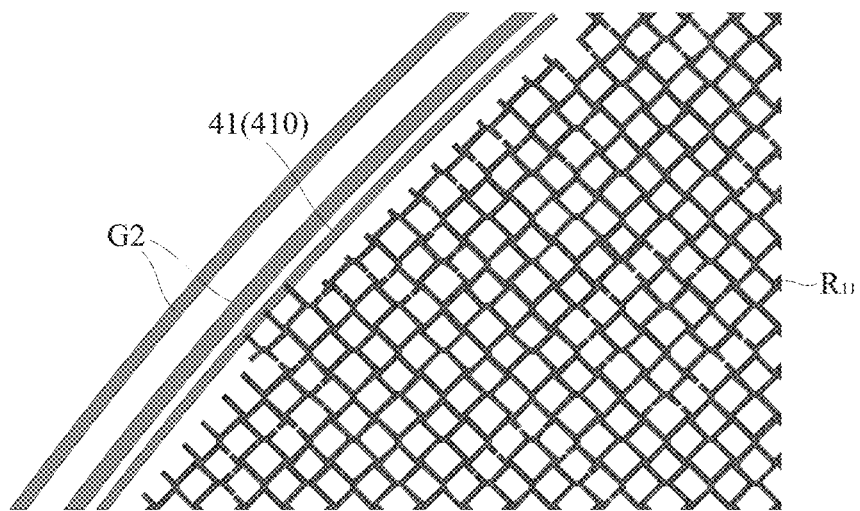
FIGS. 16 to 21 are connection diagrams of a touch electrode and a touch line of a display panel, in accordance with some embodiments.

FIG. 16 shows a case where a first touch electrode $R_{11}$ in the 1st column of the 1st row of the first touch units 31 is electrically connected to a touch line 4 of the first touch line group 41.

Figure 17:
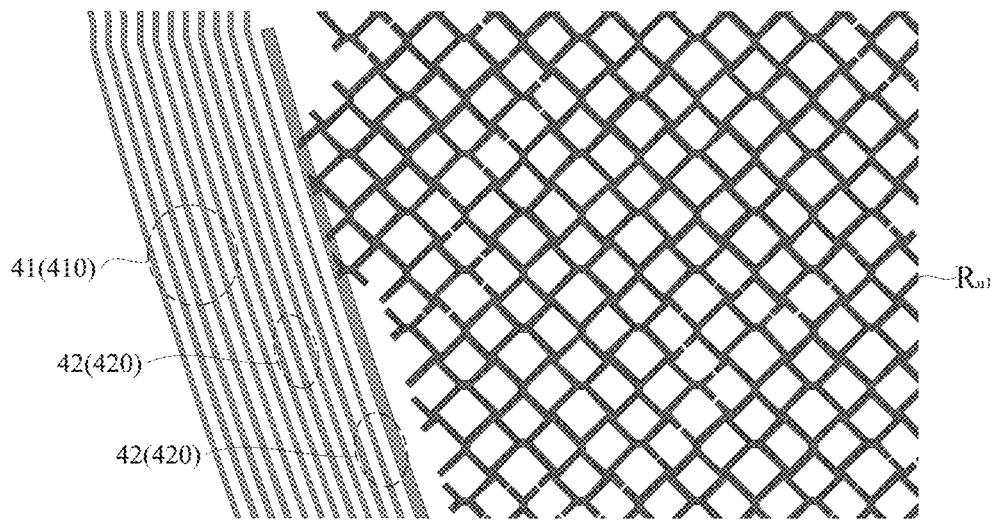

FIG. 17 shows a case where a first touch electrode $R_{u1}$ in the 1st column of the u-th row of the first touch units 31 is electrically connected to a touch line 4 of the second touch line group 42.

It will be noted that, with reference to FIG. 1, "$R_{pq}$" refers to a first touch electrode 310 in a q-th column of a p-th row of the first touch units 31, where p is a number in a range of 1 to u, inclusive, and q is a number in a range of 1 to m, inclusive.

It will be seen that, in the second direction Y, position(s) where the touch line(s) 4 of the second touch line group 42 electrically connected to the touch unit(s) 3 are closer to the first fanout region FA1 compared with position(s) where the touch line(s) 4 of the first touch line group 41 electrically connected to the touch unit(s) 3, so that the average length of the touch line(s) 4 of the second touch line group 42 is less than the average length of the touch line(s) 4 of the at least one first touch line group 41.

For example, the average length of the touch line(s) 4 of the second touch line group 42 is less than the average length of the touch line(s) 4 of a single first touch line group 41.

In some embodiments, as shown in FIGS. 2 and 4, the average length of all the touch lines 4 of the second touch line group 42 is less than the average length of all the touch lines 4 of at least one first touch line group 41.

As shown in FIG. 1, the plurality of second touch units 32 include second touch units from a first column to a m-th column arranged side by side in the first direction X, where m is a number greater than or equal to 2 (m≥2). Each second touch unit 32 includes a plurality of second touch electrodes 320 (assuming n second touch electrodes 320 are included, and n is a number greater than or equal to 2 (n≥2)) and a plurality of second connection bridges 321. Two adjacent second touch electrodes 320 are electrically connected to each other through a second connection bridge 321.

Figure 18:
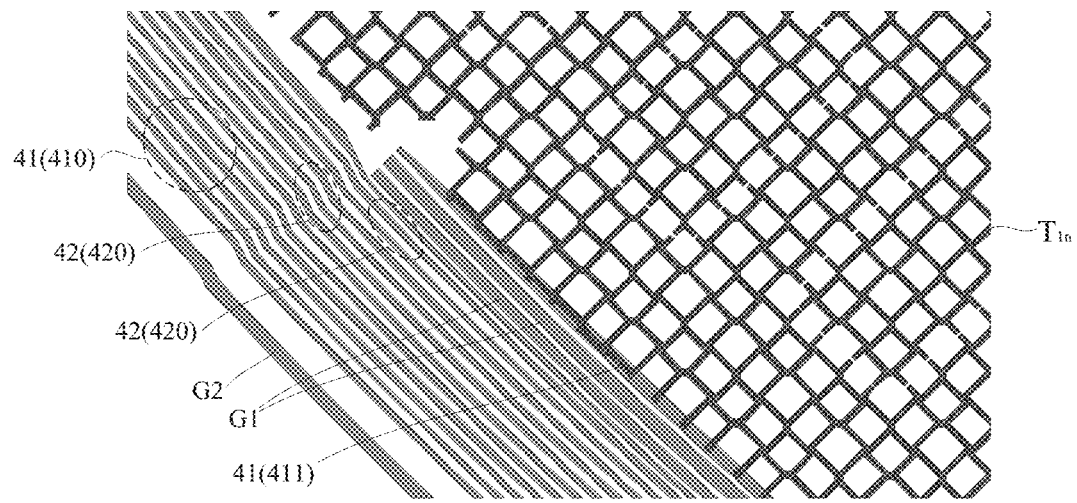

FIG. 18 shows a case where an n-th second touch electrode $T_{1n}$ in the 1st column of the second touch units 32 is electrically connected to a touch line 4 of the first touch line group 41.

FIG. 19 shows a case where an n-th second touch electrode $T_{nm}$ in the m-th column of the second touch units 32 is electrically connected to a touch line 4 of the second touch line group 42.

It will be noted that, with reference to FIG. 1, "$T_{xy}$" refers to a second touch electrode 320 in an x-th row of a second touch unit 32 in a y-th column, where x is a number in a range of 1 to m, inclusive, and y is a number in a range of 1 to n, inclusive.

It will be seen that, the average length of the touch line(s) 4 of the second touch line group 42 is less than the average length of the touch line(s) 4 of the at least one first touch line group 41.

For example, the average length of the touch line(s) 4 of the second touch line group 42 is less than an average length of the touch line(s) 4 of a single first touch line group 41.

In some embodiments, the display substrate 1 further includes a first conductive layer, as show in FIG. 22. The first conductive layer may be the first gate conductive layer 106, the second gate conductive layer 108 or the source-drain conductive layer 110 described above. In a case where the source-drain conductive layer 110 includes a plurality of layers, the first conductive layer may be any one of the plurality of layers. The following embodiments of the present disclosure will be described by taking an example where the first conductive layer is the source-drain conductive layer 110.

The source-drain conductive layer 110 includes a first power supply voltage line. As shown in FIGS. 2 and 4, the first power supply voltage line V1 extends from the first fanout region FA1 to the bonding region BD sequentially through the bending region BA and the second fanout region FA2.

The plurality of touch lines 4 each include a touch connection segment 40 located in the first fanout region FA1 and the second fanout region FA2, an orthogonal projection of the touch connection segment 40 on the substrate 10 at least partially overlap with an orthogonal projection of the first power supply voltage line V1 on the substrate 10.

It will be noted that, the first power supply voltage line V1 is used for transmitting a first voltage signal, and the first voltage signal is a constant voltage signal. For example, the first power supply voltage line V1 may be electrically connected to the VSS line in the peripheral region. The first power supply voltage line V1 is used for transmitting a VSS signal, and the VSS signal is a constant low voltage signal.

In addition, a width of the first power supply voltage line V1 is set to be greater than a width of a signal line for transmitting a non-constant voltage signal. Here, the signal line for transmitting the non-constant voltage signal may be, for example, a touch line 4, a compensation line 5, a gate line, a data line or a clock signal line. With such a design, a loss or a voltage drop generated when the first supply voltage signal is transmitted may be reduced.

In the embodiments of the present disclosure, the orthogonal projection of the touch connection segment 40 on the substrate 10 at least partially overlap with the orthogonal projection of the first power supply voltage line V1 on the substrate 10, thus the first power supply voltage signal may be used to shield a voltage signal transmitted by a signal line located on a side of the first power supply voltage line V1 proximate to the substrate 10, so that the mutual interference between the voltage signal transmitted by the signal line and the voltage signal transmitted by the touch connection segment 40 is weakened.

For example, in the case where the first conductive layer is the source-drain conductive layer 110, and the first power supply voltage line V1 is located in the source-drain conductive layer 110, the signal line, on the side of the first power supply voltage line V1 proximate to the substrate 10, may be the gate line, the data line, the clock signal line, etc. In this case, with the above design, the voltage signal transmitted by the gate line, the data line or the clock signal line may be shielded by the first power supply voltage signal, so that the mutual interference between the voltage signal transmitted by the signal line and the voltage signal transmitted by the touch connection segment 40 is weakened.

Similarly, in some embodiments, as shown in FIGS. 2 and 4, orthogonal projections of the compensation lines 5 on the substrate 10 at least partially overlap with the orthogonal projection of the first power supply voltage line V1 on the substrate 10. The first power supply voltage signal may be used to shield the voltage signal transmitted by the signal line on the side of the first power supply voltage line V1 proximate to the substrate 10, so that the mutual interference between the voltage signal transmitted by the signal line and a voltage signal transmitted by the compensation line 5 is weakened.

In some embodiments, as shown in FIGS. 2 and 4, orthogonal projections of one or more compensation lines 5 on the substrate 10 are located within the orthogonal projection of the first power supply voltage line V1 on the substrate 10. It will be understood that, the at least one compensation line 5 is routed in a zigzag on a side of the first power supply voltage line V1 away from the substrate 10, so that the first power supply voltage signal may be used to shield the voltage signal transmitted by the signal line on the side of the first power supply voltage line V1 proximate to the substrate 10. As a result, the mutual interference between the voltage signal transmitted by the signal line and a voltage signal transmitted by the at least one compensation line 5 is weakened.

For example, the orthogonal projections of all compensation lines 5 on the substrate 10 are all located within the orthogonal projection of the first power supply voltage line V1 on the substrate 10, so that the mutual interference between the voltage signal transmitted by the signal line on the side of the first power supply voltage line V1 proximate to the substrate 10 and each of voltage signals transmitted by all the compensation lines 5 is weakened.

Figure 6:
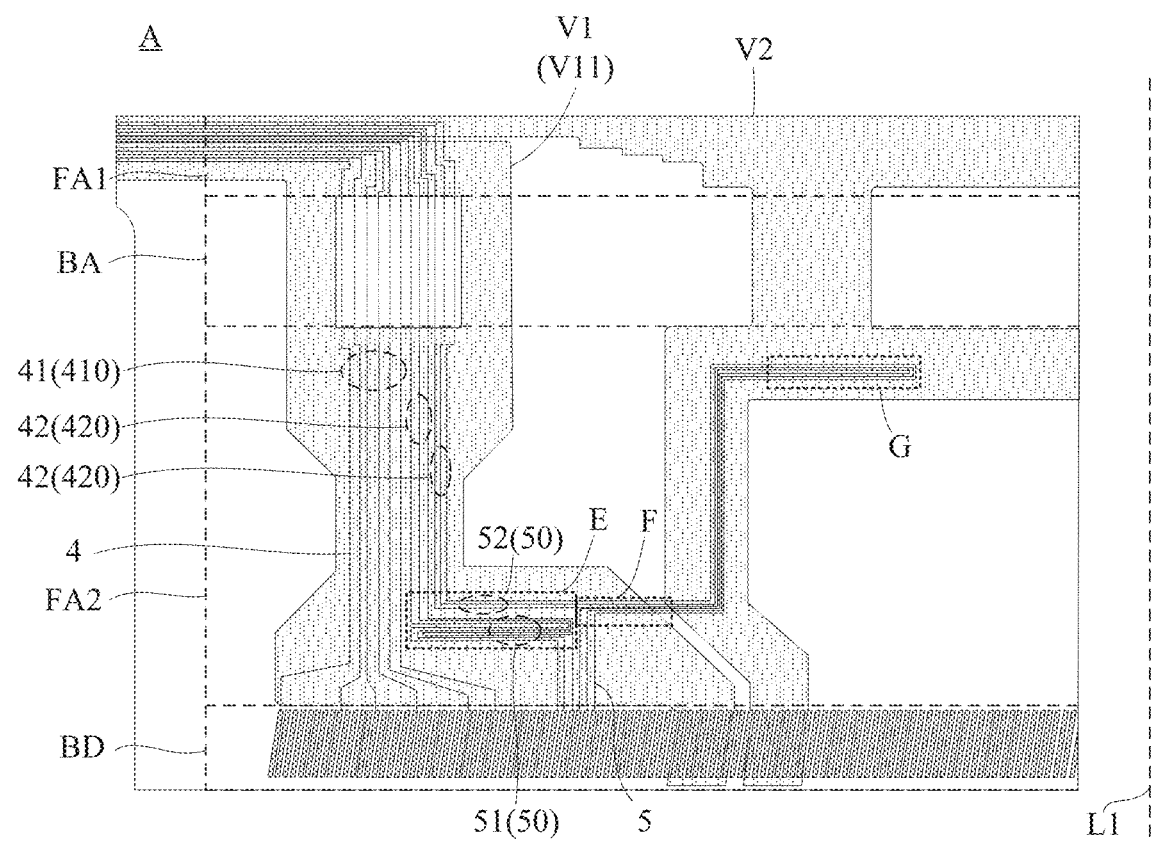
FIG. 6 is another partial enlargement view of the region A of the display panel in FIG. 1, in accordance with some embodiments.
Figure 13:
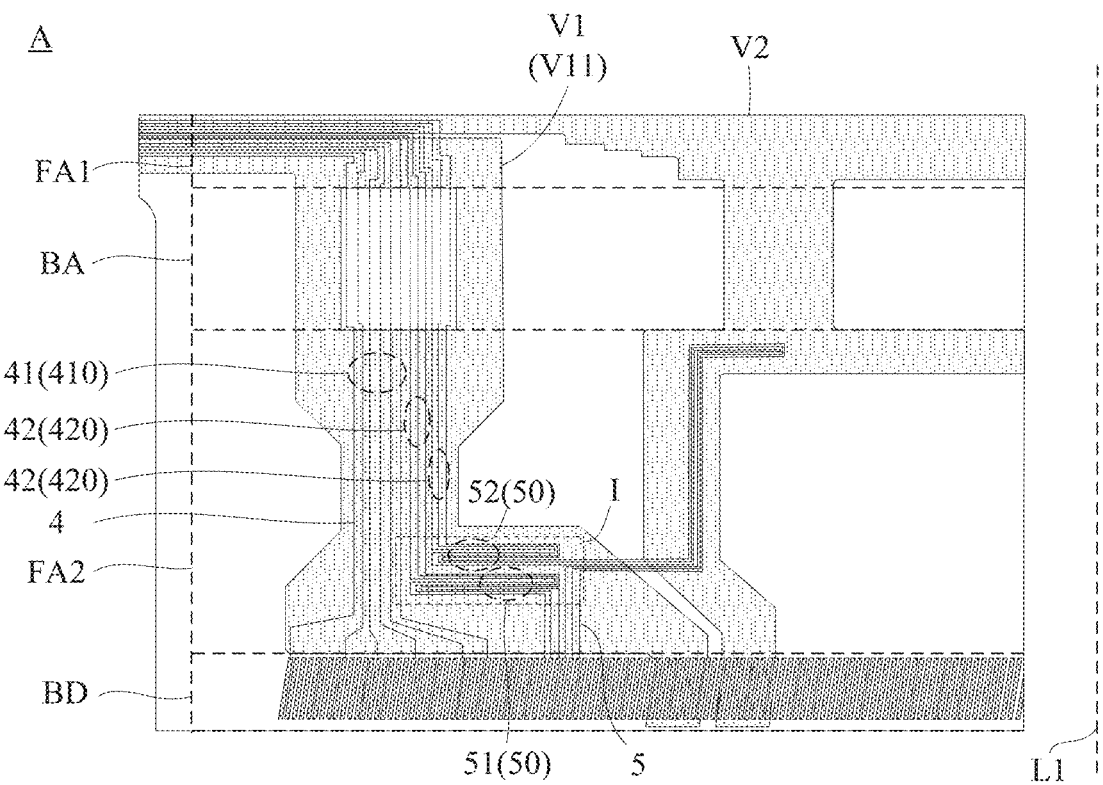
FIG. 13 is yet another partial enlargement view of the region A of the display panel in FIG. 1, in accordance with some embodiments.

For example, as shown in FIGS. 6 and 13, orthogonal projections of some compensation lines 5 on the substrate 10 are within the orthogonal projection of the first power supply voltage line V1 on the substrate 10, so that the mutual interference between the voltage signal transmitted by the signal line on the side of the first power supply voltage line V1 proximate to the substrate 10 and each of voltage signals transmitted by those compensation lines 5 is weakened. Moreover, orthogonal projections of some other compensation lines 5 on the substrate 10 extend beyond the orthogonal projection of the first power supply voltage line V1 on the substrate 10. For example, orthogonal projections of the some other compensation lines 5 on the substrate 10 extend to within an orthogonal projection of a second power supply voltage line V2 on the substrate 10.

Figure 11:
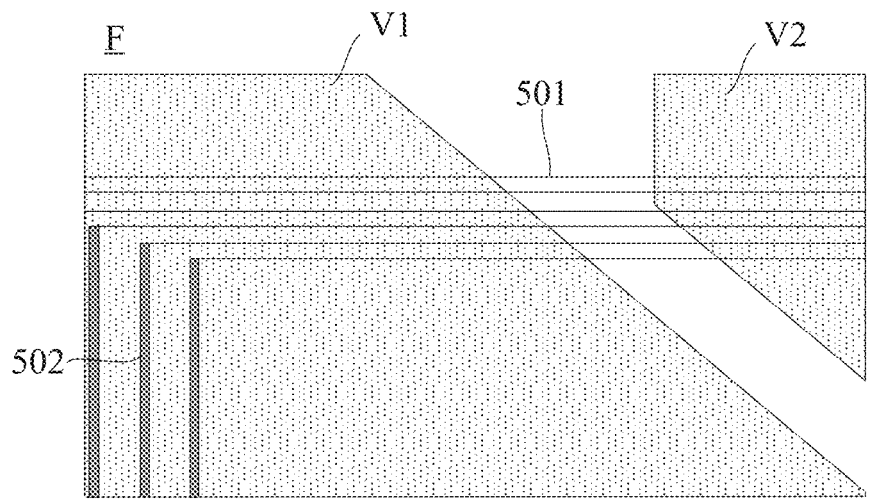
FIG. 11 is a partial enlargement view of the region F of the display panel in FIG. 6.
Figure 12:
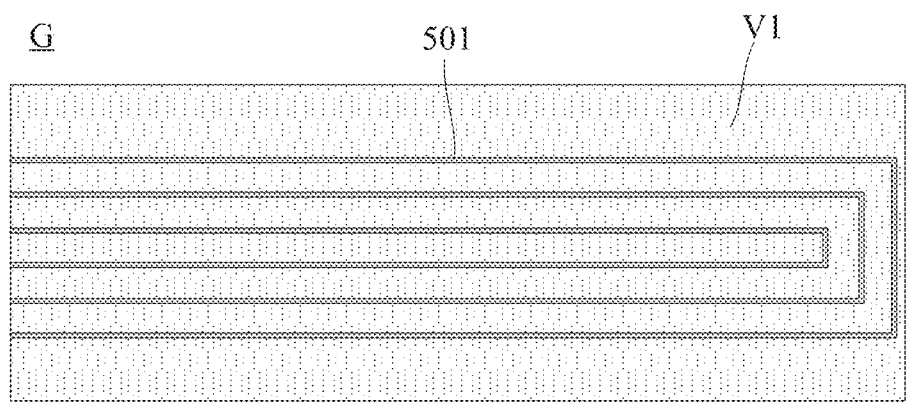
FIG. 12 is a partial enlargement view of the region G of the display panel in FIG. 6.

In some embodiments, as shown in FIGS. 6, 11 and 12, the source-drain conductive layer 110 further includes the second power supply voltage line V2. The second power supply voltage line V2 extends from the first fanout region FA1 to the bonding region BD sequentially through the bending region BA and the second fanout region FA2.

Orthogonal projections of another one or more compensation lines 5 on the substrate 10 partially overlap with the orthogonal projection of the first power supply voltage line V1 on the substrate 10, and partially overlap with the orthogonal projection of the second power supply voltage line V2 on the substrate 10.

It will be noted that, the second power supply voltage line V2 is used for transmitting a second voltage signal, and the second voltage signal is a constant voltage signal. For example, the second power supply voltage line V2 may be a VDD bus, which is electrically connected to the VDD lines in the display region AA. The second power supply voltage line V2 is used for transmitting a VDD signal, and the VDD signal is a constant high voltage signal.

Moreover, a width of the second power supply voltage line V2 is set to be greater than the width of the signal line used for transmitting the non-constant voltage signal. Here, the signal line for transmitting the non-constant voltage signal may be, for example, a touch line 4, a compensation line 5, a gate line, a data line or a clock signal line. With such a design, a loss or a voltage drop generated when the first supply voltage signal is transmitted may be reduced.

In the embodiments of the present disclosure, the one or more compensation lines 5 are each routed in a zigzag on the side of the first power supply voltage line V1 away from the substrate 10, and extend to a side of the second power supply voltage line V2 away from the substrate 10 to be routed in a zigzag, so that a trace length of the compensation line 5 is increased, and a resistance of the compensation line 5 is increased.

Moreover, the second power supply voltage line V2 is used for transmitting a second power supply voltage signal, and the second power supply voltage signal is the constant voltage signal. The orthogonal projection of the at least one compensation line 5 on the substrate 10 partially overlaps with the orthogonal projection of the first power supply voltage line V1 on the substrate 10 and partially overlaps with the orthogonal projection of the second power supply voltage line V2 on the substrate 10, so that the voltage signal transmitted by the signal line located on the side of the first power supply voltage line V1 proximate to the substrate 10 may be shielded by the second power supply voltage signal, and the voltage signal transmitted by the signal line located on the side of the second power supply voltage line V2 proximate to the substrate 10 is shielded by the second power supply voltage signal. As a result, the mutual interference between the voltage signal transmitted by the signal line and the voltage signal transmitted by the compensation line 5 is weakened.

For example, in the case where the first conductive layer is the source-drain conductive layer 110, and the second power supply voltage line V2 is located in the source-drain conductive layer 110, the signal line on the side of the second power supply voltage line V2 proximate to the substrate 10 may be a gate line, a data line or a clock signal line. In this case, with the above design, the voltage signal transmitted by the signal line located on the side of the second power supply voltage signal line V2 proximate to the substrate 10 may be shielded by the second power supply voltage signal, so that the mutual interference between the voltage signal transmitted by the signal line and the voltage signal transmitted by the touch connection segment 40 is weakened.

In some embodiments, as shown in FIGS. 6 and 11, an orthogonal projection of at least one compensation line 5 on the substrate 10 is located within the orthogonal projection of the first power supply voltage line V1 on the substrate 10. Moreover, an orthogonal projection of another at least one compensation line 5 on the substrate 10 partially overlaps with the orthogonal projection of the first power supply voltage line V1 on the substrate 10, and partially overlaps with the orthogonal projection of the second power supply voltage line V2 on the substrate 10.

In some embodiments, as shown in FIG. 6, at least one compensation line 5 is bent once on a side of the first power supply voltage line V1 away from the substrate 10, and is bent a plurality of times on a side of the second power supply voltage line V2 away from the substrate 10.

In some embodiments, as shown in FIG. 13, at least one compensation line 5 is bent a plurality of times on the side of the first power supply voltage line V1 away from the substrate 10, and is bent a plurality of times on the side of the second power supply voltage line V2 away from the substrate 10.

In some embodiments, as shown in FIG. 1, the display panel 100 has a center line L1 extending in the second direction Y, and two sides of the center line L1 are respectively referred to as "first-side L" and "second-side R".

For example, with reference to FIG. 1, the "first-side L" may refer to a left side of the center line L1 extending in the second direction Y of the display panel 100; the "second-side R" may refer to a right side of the center line L1 extending in the second direction Y of the display panel 100.

A layout design of the touch lines 4 on the first-side L of the display panel 100 will be described below.

In some embodiments, as shown in FIGS. 1 and 2, the first power supply voltage line V1 includes a first connection portion V11 located in the first fanout region FA1, the bending region BA and the second fanout region FA2, and the first connection portion V11 is located on the first-side L of the center line L1 extending in the second direction Y of the display panel 100.

Figure 3:
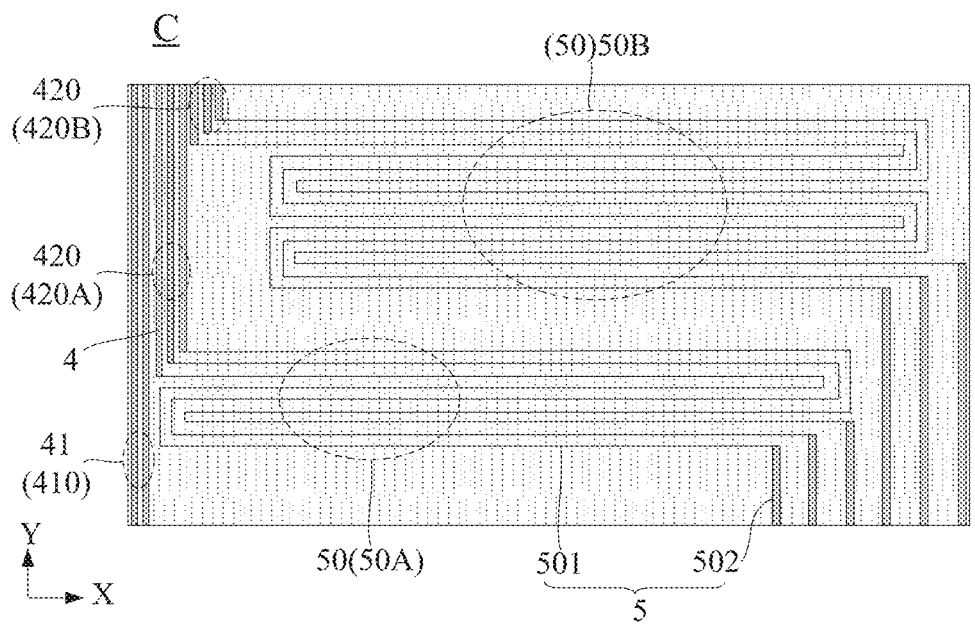
FIG. 3 is a partial enlargement view of the region C of the display panel in FIG. 2.

As shown in FIGS. 2 and 3, touch lines 4 each include a touch connection segment 40 located in the first fanout region FA1 and the second fanout region FA2. Touch lines 4 to which touch connection segments 40, whose orthogonal projections on the substrate located within the orthogonal projection of the first connection portion V11 on the substrate, belong include at least one first-side first touch line group 410 and N first-side second touch line groups 420, where N is a number greater than or equal to 2 (N≥2).

From a 1st first-side second touch line group 420 to an N-th first-side second touch line group 420, average resistances of all touch lines 4 of respective first-side second touch line groups 42 are sequentially reduced. In N compensation line groups 50 (i.e., a 1st compensation line group 50 to an N-th compensation line group 50) corresponding to the N first-side second touch line groups 42, average resistances of all compensation lines 5 of respective compensation line groups 50 are sequentially increased. An i-th first-side second touch line group 420 is electrically connected to an i-th compensation line group 50, where i is a number in an range of 1 to N, inclusive.

The i-th first-side second touch line group 420 is electrically connected to the i-th compensation line group 50, that is, a first-side second touch line group 420 with a relative small average resistance of all touch lines 4 thereof is electrically connected to a compensation line group 50 with a relative large average resistance of all compensation lines 5 thereof, and a first-side second touch line group 420 with a relative large average resistance of all touch lines 4 thereof is electrically connected to a compensation line group 50 with a relative small average resistance of all compensation lines 5 thereof; in this way, average resistances of all compensation touch lines 45 in groups (the first-side second touch line groups 420 and the respective compensation line groups 50) are approximately equal, and voltage drops generated by all groups of compensation touch line 45 while transmitting voltage signals are approximately equal, and in a case where each group of compensation touch line 45 receives a same voltage signal, it is beneficial to improve uniformity of touch units 3 electrically connected to the all groups of compensation touch line 45.

For example, as shown in FIGS. 2 and 3, the touch lines 4 to which the touch connection segments 40, whose orthogonal projections on the substrate located within the orthogonal projection of the first connection portion V11 on the substrate, belongs include one first-side first touch line group 410 and two first-side second touch line groups 420; moreover, there are two compensation line groups 50.

An average resistance of all touch lines 4 in a first first-side second touch line group 420A is greater than an average resistance of all touch lines 4 in a second first-side second touch line group 420B. The first first-side second touch line group 420A is electrically connected to a first compensation line group 50A, and the second first-side second touch line group 420B is electrically connected to the second compensation line group 50B. An average resistance of all compensation lines 5 in the first compensation line group 50A is less than an average resistance of all compensation lines 5 in the second compensation line group 50B.

For example, in the 1st first-side second touch line group 420 to the N-th first-side second touch line group 420, each first-side second touch line group 420 includes a single touch line 4, and correspondingly, in the 1st compensation line group 50 to the N-th compensation line group 50, each compensation line group 50 includes a single compensation line 5. A touch line 4 in the i-th first-side second touch line group 420 is electrically connected to a compensation line 5 in the i-th compensating wire group 50.

In some embodiments, as shown in FIG. 2, the at least one first-side first touch line group 410 and the N first-side second touch line groups 420 are sequentially disposed in the first direction X, and the N first-side second line groups are closer to the center line L1 extending in the second direction Y of the display panel 100 than the at least one first-side first line group 410.

It will be understood that, referring to FIGS. 1, 16 and 17, in the second direction Y, a touch unit 3 electrically connected to the at least one first-side first touch line group 410 is far away from the first fanout region FA1 relative to touch units 3 electrically connected to the N first-side second touch line groups 420. The N first-side second touch line groups 420 are closer to the center line L1 extending in the second direction Y of the display panel 100 than the at least one first-side first touch line group 410, so that any intersection between the touch lines 4 in the N first-side second touch line groups 420 and the touch line(s) 4 in the at least one first-side first touch line group 410 may be avoided.

As shown in FIG. 2, the N compensation line groups 50 are all located on a side of the at least one first-side first touch line group 410 proximate to the center line L1 extending in the second direction Y of the display panel 100, so that any intersection between the compensation lines 4 in the N compensation line groups 50 and the touch line(s) 4 in the at least one first-side first touch line group 410 may be avoided, which is convenient to electrically connect the compensation lines 4 in the compensation line group 50 to the touch lines 4 in the first-side second touch line group 420.

For example, as shown in FIG. 2, the first-side first touch line group 410 and the two first-side second touch line groups 420 are sequentially disposed in the first direction X, and the two first-side second touch line groups 420 are closer to the center line L1 extending in the second direction Y of the display panel 100 than the first-side first touch line group 410. Both of the two compensation line groups 50 are both located on a side of the first touch line group 410 proximate to the center line L1 extending in the second direction Y of the display panel 100.

In some embodiments, as shown in FIG. 2, orthogonal projections of the N compensation line groups 50 on the substrate 10 are all located within the orthogonal projection of the first connection portion V11 of the first power supply voltage line V1 on the substrate 10, and all compensation lines 5 in the N compensation line groups 50 are routed in a zigzag on the side of the first power supply voltage line V1 away from the substrate 10, so that the voltage signal transmitted by the signal line located on the side of the first power supply voltage line V1 proximate to the substrate 10 may be shielded by the first power supply voltage signal transmitted by the first power supply voltage line V1, so as to weaken the mutual interference between the voltage signal transmitted by the signal line and a voltage signal transmitted by each of the compensation lines 5.

In some embodiments, as shown in FIGS. 6 and 13, the second power voltage line V2 is located on a side of the first connection portion V11 proximate to the center line L1 extending in the second direction Y of the display panel 100.

The N compensation line groups 50 include at least one first target compensation line group 51 and at least one second target compensation line group 52. An orthogonal projection of the first target compensation line group 51 on the substrate 10 is within the orthogonal projection of the first connection portion V11 on the substrate 10, compensation lines 5 in the first target compensation line group 51 are routed in a zigzag on the side of the first power supply voltage line V1 away from the substrate 10, so that the mutual interference between the voltage signal transmitted by the signal line located on the side of the first power supply voltage line V1 proximate to the substrate 10 and the voltage signal transmitted by each of the compensation lines 5 of the first target compensation line group 51 is weakened.

As shown in FIGS. 6 and 13, an orthogonal projection of the second target compensation line group 52 on the substrate 10 partially overlaps with the orthogonal projection of the first connection portion V11 on the substrate 10, and partially overlaps with the orthogonal projection of the second power supply voltage line V2 on the substrate 10.

The compensation lines 5 of the second target compensation line group 52 are routed in a zigzag on the side of the first power supply voltage line V1 away from the substrate 10, and extend to the side of the second power supply voltage line V2 away from the substrate 10 to be routed in a zigzag, trace lengths of the compensation lines 5 of the second target compensation line group 52 each may be increased, so that resistances of the compensation lines 5 are each increased.

Moreover, the voltage signal transmitted by the signal line located on the side of the first power supply voltage line V1 proximate to the substrate 10 may be shielded by the first power supply voltage signal, and the voltage signal transmitted by the signal line located on the side of the second power supply voltage line V2 proximate to the substrate 10 is shielded by the second power supply voltage signal, so that the mutual interference of the voltage signal transmitted by the signal line and the voltage signal transmitted by each of the compensation lines 5 of the second target compensation line group 51 is reduced.

For example, as shown in FIGS. 6 and 13, the N compensation line groups 50 include a first target compensation line group 51 (i.e. the first compensation line group 50A) and a second target compensation line group 52 (i.e. the second compensation line group 50B).

In some embodiments, as shown in FIGS. 6 and 13, a first-side second touch line group 420 corresponding to the second target compensation line group 52 is located on a side of a first-side second touch line group 420 corresponding to the first target compensation line group 51 proximate to the center line L1 extending in the second direction Y of the display panel 100.

It will be understood that, in the second direction Y, touch units 3 electrically connected to the second touch line group 420 corresponding to the first-side second target compensation line group 52 are closer to the first fanout region FA1 than touch units 3 electrically connected to the second touch line group 420 corresponding to the first-side second target compensation line group 51. The first-side second touch line group 420 corresponding to the second target compensation line group 52 located on the side of the first-side second touch line group 420 corresponding to the first target compensation line group 51 proximate to the center line L1 extending in the second direction Y of the display panel 100, so that any intersection between the compensation line(s) 5 in the second target compensation line group 52 and the compensation line(s) 5 in the first target compensation line group 51 is avoided.

In some embodiments, as shown in FIG. 1, the plurality of first touch units 31 are divided into a plurality of groups of first touch units. Each group of first touch units 31 includes one first touch unit 31; alternatively, each group of first touch units 31 includes first touch units 31 adjacent in the second direction Y. The plurality of groups of first touch units 31 are in one-to-one correspondence with the at least one first-side first touch line group 410 and the N first-side second touch line groups 420, and at least one touch line 4 of each first-side first touch line group 410 and at least one touch line 4 of each first-side second touch line group 420 are respectively electrically connected to at least one first touch unit 31 in a respective group of first touch units.

In the second direction Y, at least one group of first touch units corresponding to the at least one first-side first touch line group 410, and N groups of first touch units corresponding to from the first first-side second touch line group 420 to the N-th first-side second touch line group 420 are sequentially approach to the first fanout region FA1.

It will be understood that the first-side first touch line group 410 is electrically connected to a first touch unit group relatively far from the first fanout region FA1, and the first-side second touch line groups 420 are electrically connected to first touch unit groups relatively proximate to the first fanout region FA1, so that an average length of all touch lines 4 in the first-side first touch line group 410 is greater than an average length of all touch lines 4 in the first-side second touch line groups 420, and in turn, an average resistance of all touch lines 4 in the first-side first touch line group 410 is greater than an average resistance of all touch lines 4 in the first-side second touch line groups 420.

Moreover, average lengths of all touch lines 4 of respective second touch line groups 42 from the 1st first-side second touch line group 420 to the N-th first-side second touch line group 420 are sequentially reduced, so that average resistances of all touch lines 4 of respective second touch line groups 42 from the 1st first-side second touch line group 420 to the N-th first-side second touch line group 420 are sequentially reduced.

For example, as shown in FIG. 1, the plurality of first touch units 31 are divided into the plurality of groups of first touch units, and each group of first touch units 31 includes the plurality of first touch units 31 adjacent in the second direction Y. The plurality of groups of first touch units 31 are in one-to-one correspondence with the first-side first touch line group 410 and the two first-side second touch line groups 420, and each touch line 4 of each first-side first touch line group 410 and each touch line 4 of each first-side second touch line group 420 are each electrically connected to a respective first touch unit 31 in the respective group of first touch units.

In the second direction Y, the group of first touch units corresponding to the first-side first touch line group 410, and two groups of first touch unit corresponding to the 1st first-side second touch line group 420 and the 2nd first-side second touch line group 420 are sequentially approach to the first fanout region FA1.

In some embodiments, as shown in FIGS. 1, 16 and 17, the display panel 100 further has a first peripheral region BB1 and a second peripheral region BB2 located on opposite sides of the display region AA in the first direction X, and the touch lines 4 of the at least one first-side first touch line group 410 and the N first-side second touch line groups 420 are all extend from the first peripheral region BB1 to the first fan-out region FA1.

It will be understood that each touch line 4 of the at least one first-side first touch line group 410 and each touch line 4 of the N first-side second touch line group 420 are each electrically connected to the respective first touch unit 31 in the respective group of first touch units. Moreover, positions where the first touch units 31 are each electrically connected to the touch lines 4 are all located on a side of the display region AA proximate to the first peripheral region BB1. Therefore, the touch lines 4 of the at least one first-side first touch line group 410 and the N first-side second touch line groups 420 may be disposed to extend from the first peripheral region BB1 to the first fan-out region FA1, so as to achieve an arrangement of the touch lines 4 of the first-side first touch line group 410 and the first-side second touch line groups 420.

For example, as shown in FIGS. 1, 2, 6, and 13, the touch lines 4 of the first-side first touch line group 410 and the two first-side second touch line groups 420 are all extend from the first peripheral region BB1 to the first fan-out region FA1.

A layout design of the touch lines 4 on the second-side R of the display panel 100 will be described below.

In some embodiments, as shown in FIGS. 1 and 4, the first power supply voltage line V1 includes a second connection portion V12 located in the first fanout region FA1, the bending region BA and the second fanout region FA2, and the second connection portion V12 is located on the second-side R of the center line L1 extending in the second direction Y of the display panel 100.

As mentioned above, the plurality of touch lines 4 each include the touch connection segment 40 located in the first fanout region FA1 and the second fanout region FA2. As shown in FIGS. 1 and 4, touch lines 4 to which touch connection segments 40, whose orthogonal projections on the substrate located within an orthogonal projection of the second connection portion V12 on the substrate, belongs include at least one second-side first touch line group 411 and at least one second-side second touch line group 421 that are sequentially disposed in the first direction X, and the at least one second-side first touch line group 411 is closer to the center line L1 extending in the second direction Y of the display panel 100 than the at least one second-side second touch line group 421.

It will be understood that, referring to FIGS. 1 and 4, in the first direction X, the touch unit 3 electrically connected to the at least one second-side first touch line group 411 is closer to the center line L1 extending in the second direction Y of the display panel 100 than the touch unit 3 electrically connected to the at least one second-side second touch line group 421. The at least one second-side first touch line group 411 is closer to the center line L1 extending in the second direction Y of the display panel 100 than the at least one second-side second touch line group 421, so that any intersection between touch line(s) 4 in the at least one second-side first touch line group 411 and touch line(s) 4 in the at least one second-side second touch line group 421 may be avoided.

For example, as shown in FIGS. 1 and 4, the touch lines 4 to which the touch connection segments 40, whose orthogonal projections on the substrate located within the orthogonal projection of the second connection portion V12 on the substrate, belongs include a single second-side first touch line group 411 and a single second-side second touch line group 421 that are sequentially disposed in the first direction X, and the second-side first touch line group 411 is closer to the center line L1 extending in the second direction Y of the display panel 100 than the second-side second touch line group 421.

Figure 5:
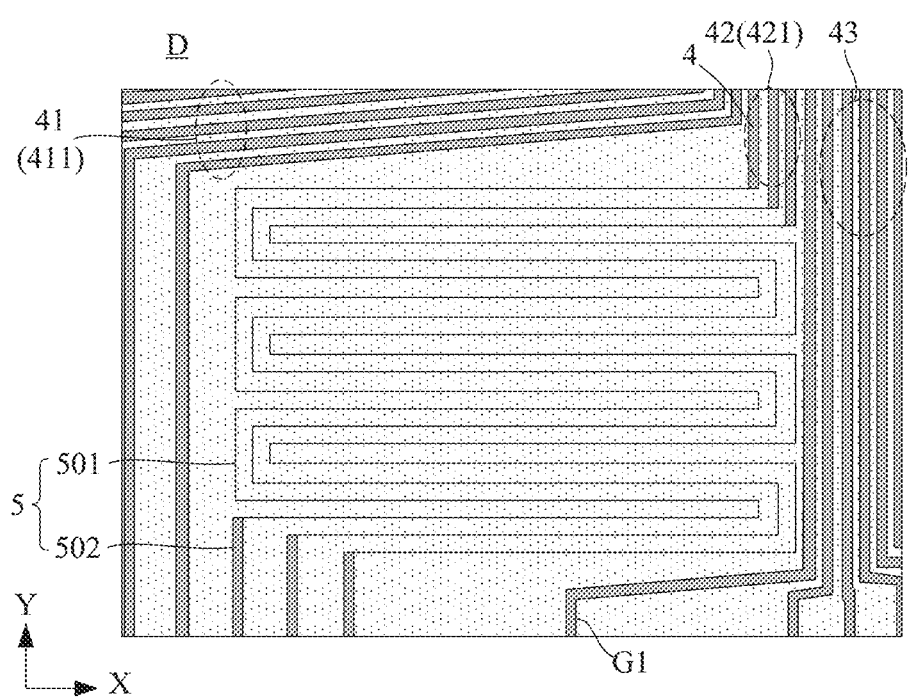
FIG. 5 is a partial enlargement view of the region D of the display panel in FIG. 4.

In some embodiments, as shown in FIGS. 4 and 5, the at least one second-side second touch line group 421 corresponds to at least one compensation line group 50, and an orthogonal projection of the at least one compensation line group 50 on the substrate 10 is within the orthogonal projection of the second connection portion V12 of the first power supply voltage line V1 on the substrate 10.

With the above-mentioned layout design of the compensation line group 50, all compensation lines 5 in the at least one compensation line group 50 are routed in a zigzag on a side of the first power supply voltage line V1 away from the substrate 10, so that the voltage signal transmitted by the signal line located on the side of the first power supply voltage line V1 proximate to the substrate 10 may be shielded by the first power supply voltage signal transmitted by the first power supply voltage line V1, and in turn, the mutual interference of the voltage signal transmitted by the signal line with the voltage signal transmitted by each of the compensation lines 5 is weakened.

For example, as shown in FIGS. 4 and 5, a second-side second touch line group 421 corresponds to a compensation line group 50, and an orthogonal projection of the compensation line group 50 on the substrate 10 is within the orthogonal projection of the second connection portion V12 of the first power supply voltage line V1 on the substrate 10.

In some embodiments, as shown in FIG. 1, the plurality of second touch units 32 are divided into a plurality of groups of second touch units. Each group of second touch units 32 includes a second touch unit 32; alternatively, each group of second touch units 32 includes second touch units 32 adjacent in the first direction X. The plurality of groups of second touch units 32 are in one-to-one correspondence with the at least one second-side first touch line group 411 and the at least one second-side second touch line group 421. At least one touch line 4 of each second-side first touch line group 411, and at least one touch line 4 of each second-side second touch line group 421 are respectively electrically connected to at least one second touch unit 32 of a respective second touch unit group.

In a direction U which is from the first connection portion V11 to the second connection portion V12 in the first direction X, at least one second touch unit group corresponding to the at least one second-side first touch line group 411 and at least one second touch unit group corresponding to the at least one second-side second touch line group 421 are sequentially disposed.

It will be understood that, the second-side first touch line group 411 is electrically connected to a group of second touch units which is far away from the second connection portion V12, and the second-side second touch line group 421 is electrically connected to a group of second touch unit groups which is proximate to the second connection portion V12, so that an average length of all touch lines 4 of the second-side first touch line group 411 is greater than an average length of all touch lines 4 of the second-side second touch line group 421; as a result, an average resistance of the all touch lines 4 in the second-side first touch line group 411 is greater than an average resistance of all touch lines 4 in the second-side second touch line group 421.

For example, as shown in FIG. 1, the plurality of second touch units 32 are divided into a plurality of groups of second touch units, and each group of the second touch units 32 includes a plurality of second touch units 32 adjacent in the first direction X. The plurality of groups of second touch units 32 are in one-to-one correspondence with a second-side first touch line group 411 and a second-side second touch line group 421. Each touch line of each second-side first touch line group 411 and each touch line of each second-side second touch line group 421 are respectively electrically connected to a second touch unit 32 of a respective second touch unit group.

In the direction U which is from the first connection portion V11 to the second connection portion V12 in the first direction X, a group of second touch units corresponding to the second-side first touch line group 411, and a group of second touch units corresponding to the second-side second touch line group 421 are sequentially disposed.

In some embodiments, as shown in FIG. 1, the display panel 100 includes a third peripheral region BB3 and a fourth peripheral region BB4 located on opposite sides of the display region AA in the second direction Y, and the first fanout region FA1, the bending region BA, the second fanout region FA2 and the bonding region BD are located in the fourth peripheral region BB4.

Touch lines 4 in the at least one second-side first touch line group 411 and in the at least one second-side second touch line group 421 are all located in the fourth peripheral region BB4.

It will be understood that each touch line 4 of the at least one second-side first touch line group 411 and each touch line 4 of the at least one second-side second touch line group 421 are respectively electrically connected to a second touch unit 32 of a respective second touch unit group; moreover, a position where each touch line 4 is electrically connected to the respective second touch unit 32 is located on a side of the display region AA proximate to the fourth peripheral region BB4. Therefore, by arranging the touch lines 4 of the at least one second-side first touch line group 411 and the at least one second-side second touch line group 421 in the fourth peripheral region BB4, trace lengths of the touch lines 4 in the second-side first touch line group 411 and the second-side second touch line group 421 may each be reduced.

For example, as shown in FIG. 4, the touch lines 4 in the second-side first touch line group 411 and the second-side second touch line group 421 are all located in the fourth peripheral region BB4.

In some embodiments, in two ends of each second touch unit 32 in the second direction Y, one end of which is electrically connected to a touch line 4 to receive a voltage signal from the touch line 4. For example, in the second direction Y, an end of each second touch unit 32 proximate to the first fanout region FA1 is electrically connected to the touch line 4. For another example, in the second direction Y, an end of each second touch unit 32 away from the first fanout region FA1 is electrically connected to the touch line 4.

In addition, in some other embodiments, both ends of each second touch unit 32 in the second direction Y are electrically connected to a touch line 4 respectively, so that the both ends of the touch unit 32 may each receive a voltage signal from the respective touch line 4.

Figure 20:
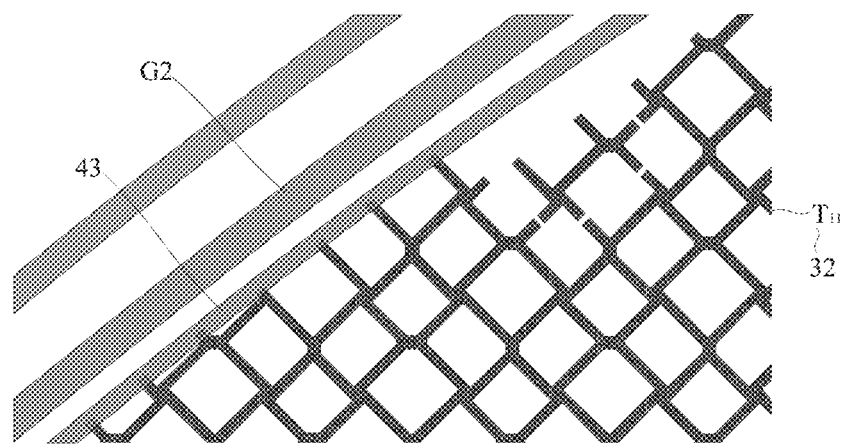
Figure 21:
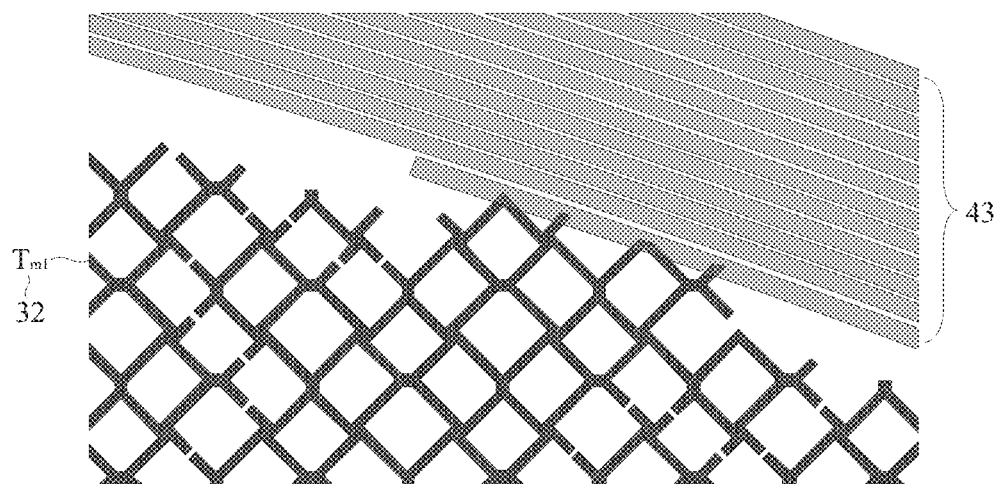

As shown in FIGS. 19, 20 and 21, the plurality of touch lines 4 further includes a third touch line group 43, and at least one touch line 4 of the third touch line group 43 is electrically connected to at least one second touch unit 32.

The touch line(s) 4 in the third touch line group 43 are assembled to the bonding region BD from the third peripheral region BB3 sequentially through the second peripheral region BB2, the first fanout region FA1, the bending region BA and the second fanout region FA2.

It will be understood that, in the second direction Y, an end of each second touch unit 32 proximate to the first fanout region FA1 is electrically connected to a touch line 4 in the second-side first touch line group 411 or in the second-side second touch line group 421. An end of each second touch unit 32 away from the first fanout region FA1 is electrically connected to a touch line 4 in the third touch line group 43.

In addition, a position where at least one touch line 4 of the third touch line group 43 is electrically connected to the at least one second touch unit 32 is located on a side of the display region AA proximate to the third peripheral region BB3. Therefore, the touch line(s) 4 in the third touch line group 43 are assembled to the bonding region BD from the third peripheral region BB3 sequentially through the second peripheral region BB2, the first fanout region FA1, the bending region BA and the second fanout region FA2, so as to achieve an arrangement of the touch line(s) 4 in the third touch line group 43.

For example, as shown in FIGS. 20 and 21, each touch line 4 of the third touch line group 43 is electrically connected to a second touch unit 32.

In some embodiments, orthogonal projections of portions, located in the first fanout region FA1 and the second fanout region FA2, of the at least one touch line 4 of the third touch line group 43 on the substrate 10 are located within the orthogonal projection of the first power supply voltage line V1 on the substrate 10.

With the above-mentioned layout design of the third touch line group 43, the voltage signal transmitted by the signal line located on the side of the first power supply voltage line V1 proximate to the substrate 10 may be shielded by the first power supply voltage signal transmitted by the first power supply voltage line V1, so that the mutual interference between the voltage signal transmitted by the signal line and a voltage signal transmitted by the at least one touch line 4 of the third touch line group 43 is reduced.

For example, as shown in FIG. 4, orthogonal projections of portions of all the touch lines 4 of the third touch line group 43 located in the first fanout region FA1 and the second fanout region FA2 on the substrate 10 are located within the orthogonal projection of the first power supply voltage line V1 on the substrate 10, so that the mutual interference between the voltage signal transmitted by the signal line located on the side of the first power supply voltage line V1 proximate to the substrate 10 and the voltage signals transmitted by each touch lines 4 of the third touch line group 43 may be weakened.

In some embodiments, as shown in FIG. 4, part of the third touch line group 43 located in the fourth peripheral region BB4 is farther away from the center line L1 extending in the second direction Y of the display panel 100 than the at least one second-side second touch line group 421.

It will be understood that, with reference to FIGS. 1 and 4, the touch lines 4 of the third touch line group 43 extend to the fourth peripheral region BB4 from the third peripheral region BB3 through the second peripheral region BB2. By means of the above-mentioned layout design of the third touch line group 43, any intersection between touch lines 4 of third touch line group 43 and touch lines 4 of the at least one second-side second touch line group 421 may be avoided.

In some embodiments, the plurality of touch lines 4 each include a touch connection segment 40 located in the first fanout region FA1 and the second fanout region FA2. Touch lines 4 to which touch connection segments 40, whose orthogonal projections on the substrate located within the orthogonal projection of the second connection portion V12 on the substrate, belong include M second-side second touch line groups 421, where M is a number greater than or equal to 2 (M≥2).

In a 1st second-side second touch line group 421 to an M-th second-side second touch line group 421, average resistances of all touch lines 4 of respective second touch line groups 42 are sequentially reduced. In M compensation line groups 50 (i.e., in a first compensation line group 50 to an M-th compensation line group 50) corresponding to the M second-side second touch line groups 421, average resistances of all compensation lines 5 of respective compensation line groups 50 are sequentially increased. A j-th second-side second touch line group 421 is electrically connected to a j-th compensation line group 50, where j is a number in a range of 1 to M, inclusive.

By electrically connecting the j-th second-side second touch line group 421 to the j-th compensation line group 50 (that is, a second-side second touch line group 421 with a small average resistance of all touch lines 4 thereof is electrically connected to a compensation line group 50 with a large average resistance of all compensation lines 5 thereof, and a second-side second touch line group 421 with a large average resistance of all touch lines 4 thereof is electrically connected to a compensation line group 50 with a small average resistance of all compensation lines 5 thereof), average resistances of all groups of compensation touch lines 45 (corresponding to second-side second touch line groups 421 and compensation line groups 50) are approximately equal, and voltage drops generated by all the groups of compensation touch lines 45 transmitting voltage signals are approximately equal; and in a case where all groups of compensation touch lines 45 receive a same voltage signal, it is beneficial to improve uniformity of voltage signals received by touch units 3 to which all groups of compensation touch lines 45 are electrically connected.

For example, FIG. 4 shows the case where the touch lines 4 to which touch connection segments 40, whose orthogonal projections on the substrate located within the range of the orthogonal projection of the second connection portion V12 on the substrate, belong include a single second-side second touch line group 421, and the second-side second touch line group 421 corresponds to a compensation line group 50.

It will be understood that, among the touch lines 4 of the second-side first touch line group 411, a resistance of a touch line 4 proximate to the second connection portion V12 is less than a resistance of a touch line away from the second connection portion V12. Therefore, part of the touch lines 4 of the second-side first touch line group 411 proximate to the second connection portion V12 may be compensated. That is, part of the touch lines 4 of the second-side first touch line group 411 are selected to constitute one or more second-side second touch line groups 421 to be electrically connected to compensation line group(s) 50.

For example, in the 1st second-side second touch line group 421 to the M-th second-side second touch line group 421, each second-side second touch line group 421 includes a single touch line 4, and correspondingly, in the first compensation line group 50 to the M-th compensation line group 50, each compensation line group 50 includes a single compensation line 5. A touch line 4 in a j-th second-side second touch line group 421 is electrically connected to a compensation line 5 in a j-th compensation line group 50.

In some embodiments, as shown in FIG. 22, the touch functional layer T includes an electrode layer 201, a first insulating layer 202 and a bridging layer 203 that are stacked on the display substrate 1; the first insulating layer 202 is located between the electrode layer 201 and the bridging layer 203, and the bridging layer 203 is located on a side of the electrode layer 201 away from the display substrate 1.

As shown in FIG. 22, the plurality of first touch electrodes, the plurality of second touch electrodes 320 and the plurality of first connection bridges 311 are disposed in the electrode layer 201. That is, the first touch electrodes, the second touch electrodes 320 and the first connection bridges 311 are disposed in a same layer. The plurality of second connection bridges 321 are disposed in the bridging layer 203.

In the first direction X, every two adjacent first touch electrodes 310 are electrically connected to each other through a first connection bridge 311. As shown in FIG. 22, in the second direction Y, the second connection bridge 321 is electrically connected to two adjacent second touch electrodes 320 through different via holes H in the first insulating layer 202.

Figure 24:
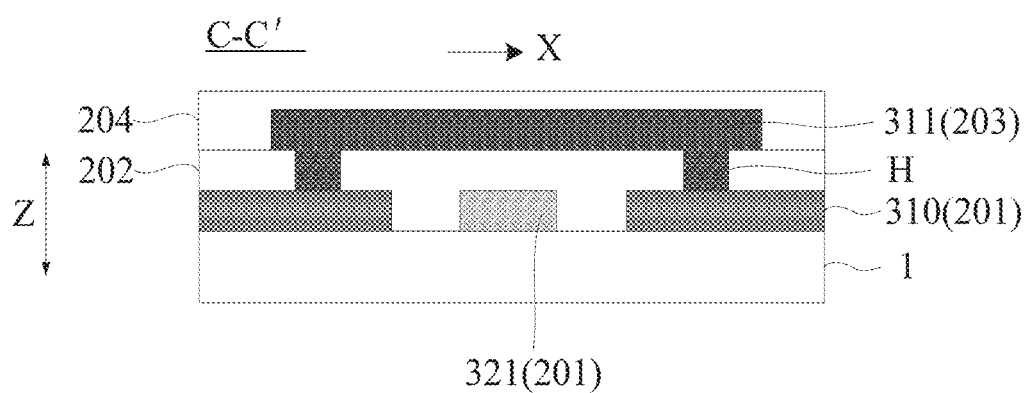
FIG. 24 is a sectional view of the display panel in FIG. 23 taken along the line C-C'.

In some embodiments, as shown in FIGS. 23 and 24, the plurality of first touch electrodes 310, the plurality of second connection bridges 321 and the plurality of second touch electrodes 320 are disposed in the electrode layer 201. That is, the first touch electrodes 310, the second connection bridges 321 and the second touch electrodes 320 are disposed in a same layer. The plurality of first connection bridges 311 are disposed in the bridging layer 203.

As shown in FIG. 24, in the first direction X, a first connection bridge 311 is electrically connected to two adjacent first touch electrodes 310 through different via holes H in the first insulating layer 202. In the second direction Y, every two adjacent second touch electrodes 320 are electrically connected to each other through a second connection bridge 321.

Figure 25:
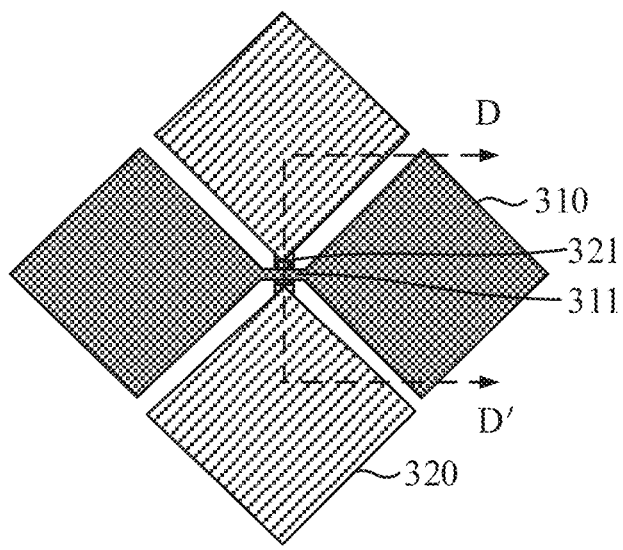
FIG. 25 is another connection diagram of touch electrodes of a display panel, in accordance with some embodiments.
Figure 26:
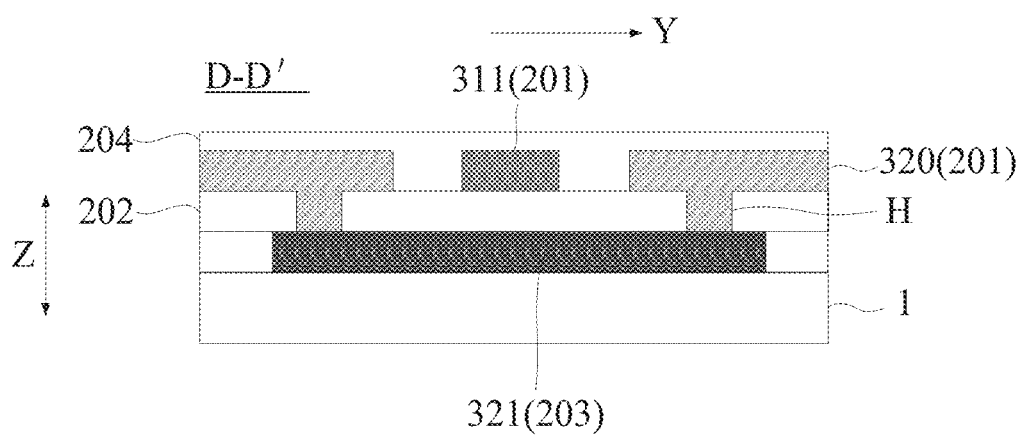
FIG. 26 is a sectional view of the display panel in FIG. 25 taken along the line D-D'.

In some other embodiments, as shown in FIGS. 25 and 26, the electrode layer 201 is located on a side of the bridging layer 203 away from the display substrate 1; the first insulating layer 202 is located between the electrode layer 201 and the bridging layer 203, and the first insulating layer 202 is provided with a plurality of via holes H therein.

The plurality of first touch electrodes 310, the plurality of second touch electrodes 320 and the plurality of first connection bridges 311 are disposed in the electrode layer 201. That is, the first touch electrodes 310, the second touch electrodes 320 and the first connection bridges 311 are disposed in a same layer. The plurality of second connection bridges 321 are disposed in the bridging layer 203.

In the first direction X, every two adjacent first touch electrodes 310 are electrically connected to each other through a first connection bridge 311. As shown in FIG. 26, in the second direction Y, two adjacent second touch electrodes 320 are electrically connected to a second connection bridge 321 through different via holes H in the first insulating layer 202.

Figure 27:
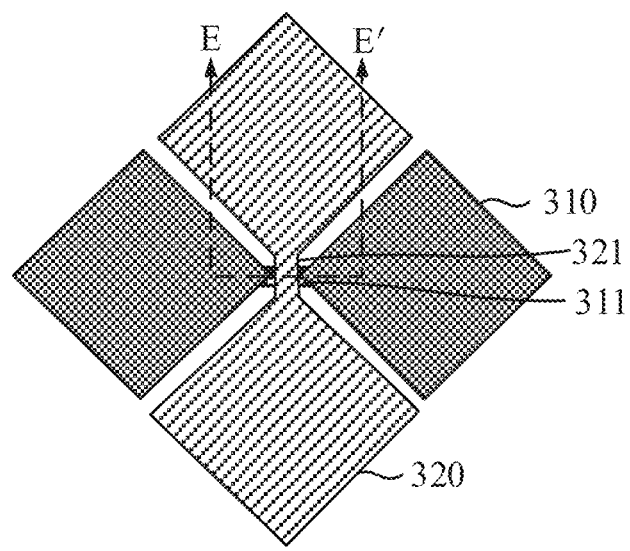
FIG. 27 is yet another connection diagram of touch electrodes of a display panel, in accordance with some embodiments.
Figure 28:
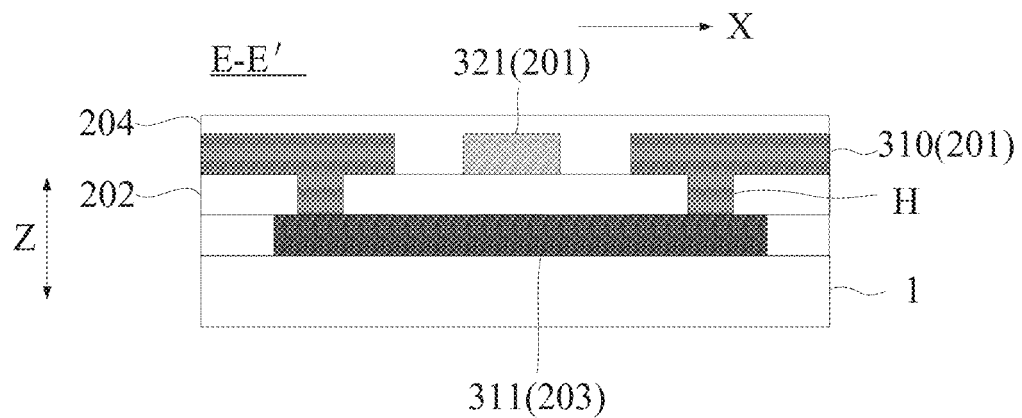
FIG. 28 is a sectional view of the display panel in FIG. 27 taken along the line E-E'.

In some embodiments, as shown in FIGS. 27 and 28, the plurality of first touch electrodes 310, the plurality of second touch electrodes 320 and the plurality of second connection bridges 321 are disposed in the electrode layer 201. That is, the first touch electrodes 310, the second touch electrodes 320 and the second connection bridges 321 are disposed in a same layer. The plurality of first connection bridges 311 are disposed in the bridging layer 203.

As shown in FIG. 28, in the first direction X, two adjacent first touch electrodes 310 are electrically connected to a first connection bridge 311 through different via holes H in the first insulating layer 202. In the first direction X, two adjacent second touch electrodes 320 are electrically connected to each other through a second connection bridge 321.

Figure 7:
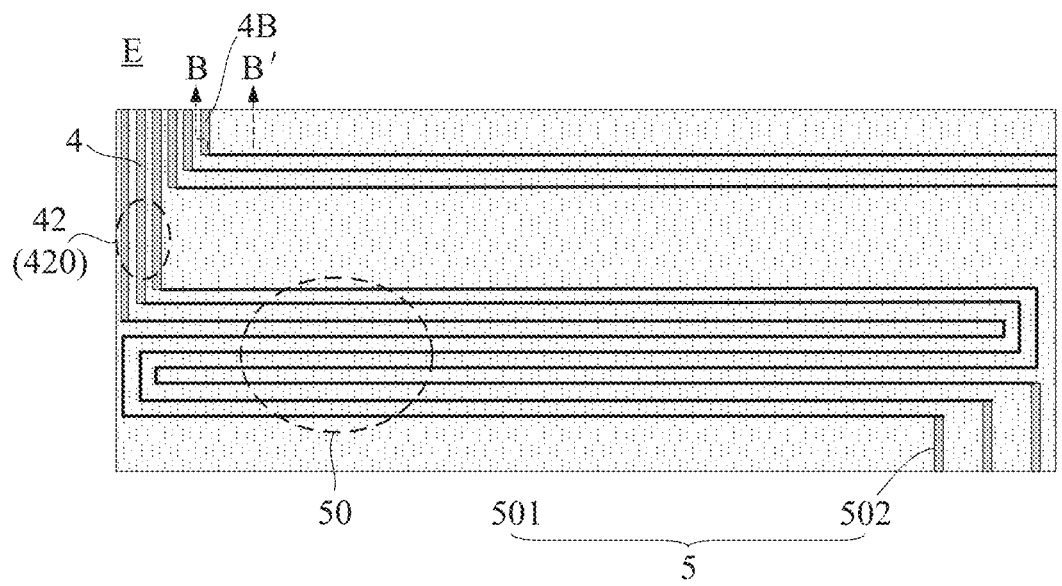
FIG. 7 is a partial enlargement view of the region E of the display panel in FIG. 6.
Figure 8:
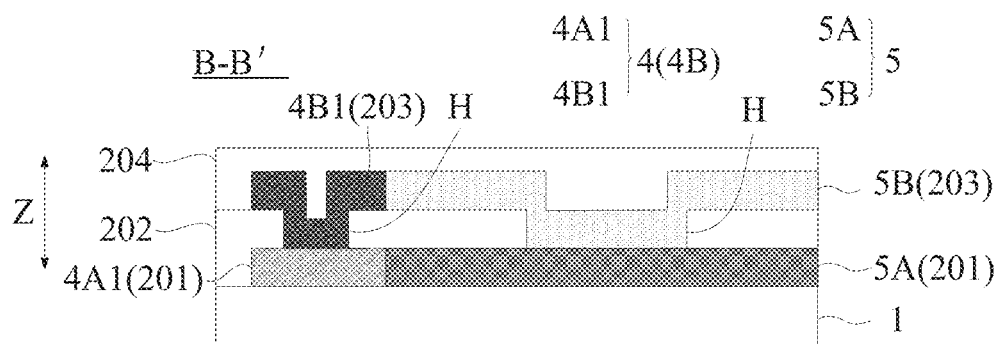
FIG. 8 is a sectional view of the display panel in FIG. 7 taken along the line B-B'.

In some embodiments, as shown in FIGS. 7 and 8, a portion of a touch line 4 (e.g., a second touch line 4B) located in the second fanout region FA2 includes a portion of a first touch sub-line 4A1 disposed in the electrode layer 201 and a portion of a second touch sub-line 4B1 disposed in the bridging layer 203, and the first touch sub-line 4A is electrically connected to second touch sub-line 4B through at least one via hole H in the first insulating layer 202 disposed between the electrode layer 201 and the bridging layer 203.

It will be noted that portions of the touch line 4 outside the second fanout region FA2 also each include a portion of the first touch sub-line 4A1 disposed in the electrode layer 201 and a portion of the second touch sub-line 4B1 disposed in the bridging layer 203. That is, the touch line 4 is formed by the first touch sub-line 4A1 and the second touch sub-line 4B1 being connected in parallel, so that the resistance of the touch line 4 may be reduced; as a result, the voltage drop generated by the touch line 4 transmitting a voltage signal may be reduced.

In some embodiments, as shown in FIGS. 7 and 8, the compensation line 5 includes a first compensation sub-line 5A disposed in the electrode layer 201 and a second compensation sub-line 5B disposed in the bridging layer 203; the first compensation sub-line 5A and the second compensation sub-line 5B are connected in parallel, that is, the compensation line 5 is a double-layer metal line.

The first compensation sub-line 5A is directly electrically connected to the first touch sub-line 4A1 of the touch line 4 of the second touch line group 42, and the second compensation sub-line 5B is directly electrically connected to the second touch sub-line 4B1 of the touch line 4 of the second touch line group 42, so that the resistance of the touch line 4 of the second touch line group 42 is compensated by the compensation line 5.

In some embodiments, as shown in FIG. 8, the first compensation sub-line 5A and the second compensation sub-line 5B of the compensation line 5 are electrically connected to each other through at least one via hole H in the first insulating layer 202, so as to realize the parallel connection of the first compensation sub-line 5A and the second compensation sub-line 5B.

Figure 9:
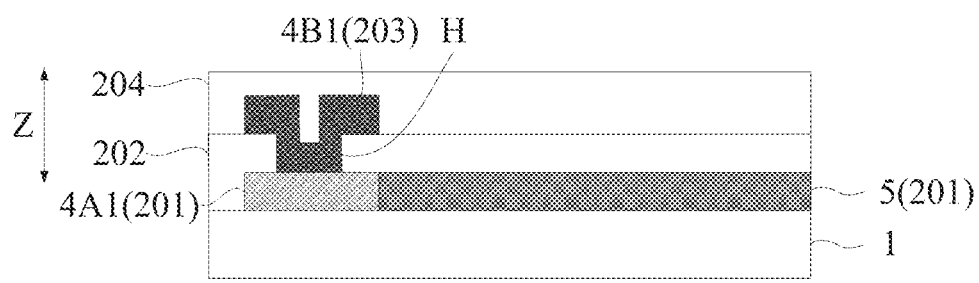
FIG. 9 is another sectional view of the display panel in FIG. 7 taken along the line B-B', in accordance with some embodiments.

In some embodiments, as shown in FIG. 9, the compensation line 5 is disposed in the electrode layer 201 and is directly electrically connected to the first touch sub-line 4A1 of the touch line 4 of the second touch line group 42.

Figure 10:
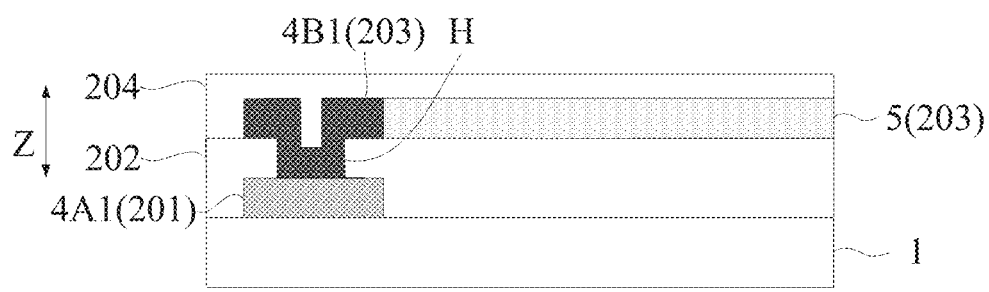
FIG. 10 is yet another sectional view of the display panel in FIG. 7 taken along the line B-B', in accordance with some embodiments.

Alternatively, as shown in FIG. 10, the compensation line 5 is disposed in the bridging layer 203 and is directly electrically connected to the second touch sub-line 4B1 of the touch line 4 of the second touch line group 42.

It will be noted that, referring to FIGS. 3 and 7, the compensation line 5 includes a main segment 501 and a connection segment 502. In the above embodiments of the present disclosure, the main segment 501 of the compensation line 5 is described as an example, that is, the main segment 501 of the compensation line 5 is disposed in the electrode layer 201, or the main segment 501 is disposed in the bridging layer 203. In addition, referring to FIG. 8, a film layer structure of the connection segment 502 of the compensation line 5 is the same as a film layer structure of the touch line 4, both of which are a double-layer metal line.

It will be understood that, compared with the compensating wire 5 which is a double-layer metal line, as shown in FIGS. 9 and 10, the compensation line 5 is a single-layer metal line, so that the resistance of the compensation line 5 is increased. Thus, the trace length of the compensation line 5 may be reduced and a space area required for routing the compensation line 5 in a zigzag may be reduced on a premise that a requirement of the resistance compensation is satisfied.

From the foregoing description, it will be seen that the average resistance of all of the touch line(s) 4 of the first touch line group 41 is greater than the average resistance of all of the touch line(s) 4 of the second touch line group 42. Therefore, in order to reduce a difference between the average resistances, it is necessary to compensate the resistance values of all of the touch line(s) 4 of the second touch line group 42 by adopting the compensation line(s) 5. Based on this, in the process of designing the compensation line 5, the following formula (1-1) may be used to determine a trace length L of the compensation line 5.

$$L = \frac{(R_{max} - R_{min}) \times W}{X} \quad (1\text{-}1)$$

"$R_{max}$" represents the resistance of the touch line 4 in the first touch line group 41; "$R_{min}$" represents the resistance of the touch line 4 in the second touch line group 42; "W" represents a line width of the compensation line 5; and "X" represents a square resistance of the compensation line 5.

In some embodiments, as shown in FIG. 8, the compensation line 5 includes the first compensation sub-line 5A and the second compensation sub-line 5B that are electrically connected to each other; in this case, the following formula (1-2) may be used to determine the square resistance X of compensation line 5.

$$X = \frac{a \times b}{a + b} \quad (1\text{-}2)$$

"a" represents a square resistance of the first compensation sub-line 5A; and "b" represents a square resistance of the second compensation sub-line 5B.

Moreover, the following formula (1-3) may be used to determine the trace length L of the compensation line 5.

$$L = \frac{(R_{max} - R_{min}) \times W}{\frac{a \times b}{a + b}} \quad (1\text{-}3)$$

For example, the line width W of the compensation line 5 is 3.5 μm, the square resistance a of the first compensation sub-line 5A is 0.186, and the square resistance b of the second compensation sub-line 5B is 0.098, then the trace length L of the compensation line 5 is expressed by L=54.5 ($R_{max}$–$R_{min}$).

In some embodiments, as shown in FIG. 9, the compensation line 5 is disposed in the electrode layer 201; in this case, the following formula (1-4) may be used to determine the trace length L of the compensation line 5.

$$L = \frac{(R_{max} - R_{min}) \times W}{a} \quad (1\text{-}4)$$

For example, the line width W of the compensation line 5 is 3.5 μm, the square resistance a of the compensation line 5 is 0.186, then the trace length L of the compensation line 5 is expressed by L=18.8($R_{max}$–$R_{min}$).

In some embodiments, as shown in FIG. 10, the compensation line 5 is disposed in the bridging layer 203; in this case, the following formula (1-5) may be used to determine the trace length L of the compensation line 5.

$$L = \frac{(R_{max} - R_{min}) \times W}{b} \quad (1\text{-}5)$$

For example, the line width W of compensation line 5 is 3.5 μm, the square resistance b of the compensation line 5 is 0.098, then the trace length L of the compensation line 5 is expressed by L=35.7($R_{max}$–$R_{min}$).

In some embodiments, as shown in FIGS. 3 and 5, the compensation line 5 is in a broken line shape; the compensation line 5 includes a plurality of broken line segments, and at least one broken line segment extends in the first direction X or the second direction Y. The first direction X intersects the second direction Y.

The compensation line 5 is in a broken line shape by bending the compensation line 5 at least once, so that an arrangement of the compensation line 5 is more compact, which is conducive to the routing in a zigzag of the compensation line 5 in a limited space of the second fanout region FA2. As a result, the trace length of the compensation line 5 is increased, and the resistance of the compensation line 5 is increased.

Moreover, at least one broken line segment of the compensation line 5 extends in the first direction X or the second direction Y, that is, some broken line segments of the compensation line 5 extend in the first direction X, and some other broken line segments extend in the second direction Y, so that the compensation line 5 is arranged neatly and regularly.

For example, the first direction X is substantially perpendicular to the second direction Y; in this case, the broken line segment of the compensation line 5 extending in the first direction X is substantially perpendicular to the broken line segment extending in the second direction Y. That is, an angle of each bend of the compensation line 5 is substantially 90°.

Figure 14:
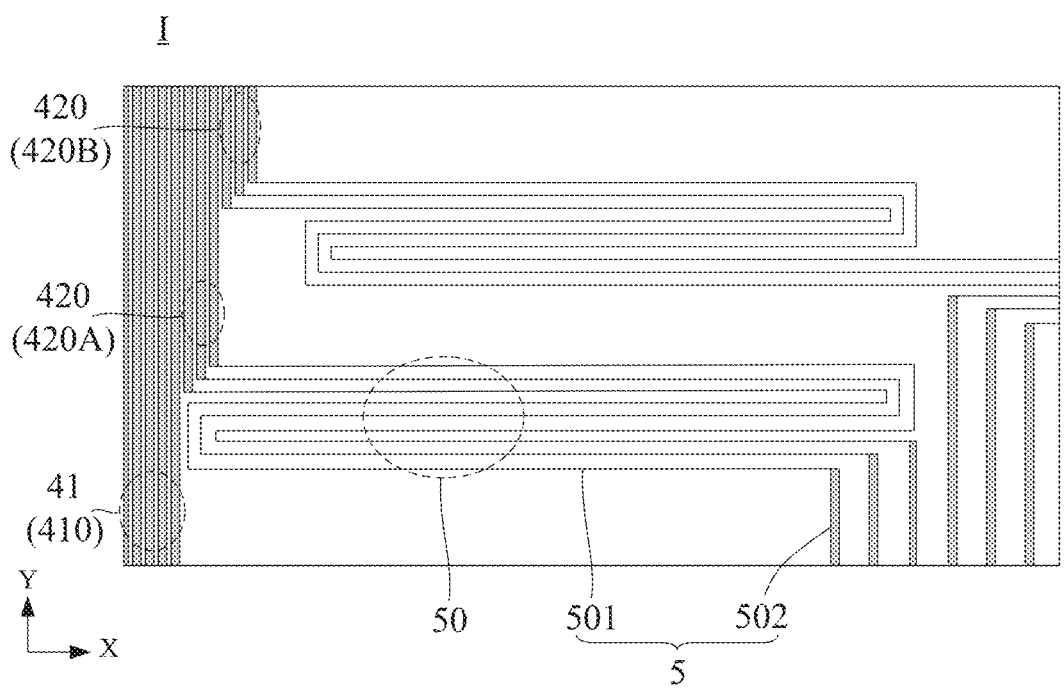
FIG. 14 is a partial enlargement view of the region I of the display panel in FIG. 13.

In some embodiments, as shown in FIG. 14, a length of the broken line segment of the compensation line 5 extending in the first direction X is greater than a length of the broken line segment of the compensation line 5 extending in the second direction Y.

Figure 15:
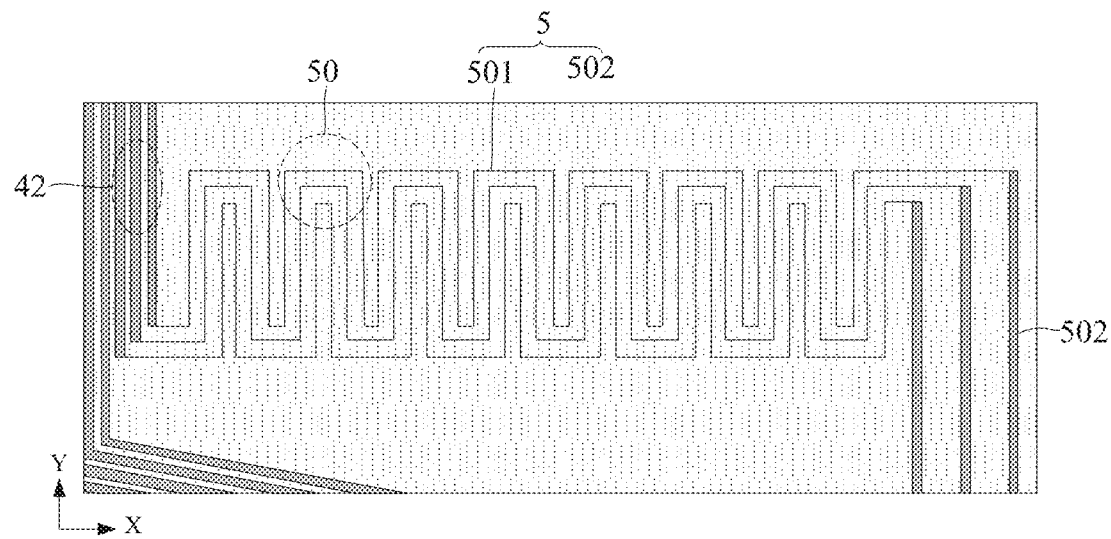
FIG. 15 is an arrangement diagram of compensation lines of a display panel, in accordance with some embodiments.

Alternatively, as shown in FIG. 15, the length of the broken line segment of the compensation line 5 extending in the second direction Y is greater than the length of the broken line segment of the compensation line 5 extending in the first direction X.

In some embodiments, as shown in FIGS. 3 and 5, an end of the main segment 501 of the compensation line 5 is electrically connected to the corresponding touch line 4, and another end of the main segment 501 after being bent at least once is electrically connected to an end of the connection segment 502; another end of the connection segment 502 away from the main segment 501 extends to the bonding region BD.

A width of the main segment 501 is less than a width of the touch line 4, so that a cross-sectional area of the main segment 501 is less than a cross-sectional area of the touch line 4. According to a law of resistance (a resistance of a conductor is proportional to a length and a resistivity of the conductor, and inversely proportional to a cross-sectional area of the conductor), in a case where the length and a resistivity of the main segment 501 are respectively the same as the length and the resistivity of the touch line 4, the resistance of the main segment 501 is greater than the resistance of the touch line 4, a trace length of the main segment 501 of the compensation line 5 may be reduced on a premise that the resistance of the main segment 501 satisfies the compensation requirement.

In some embodiments, as shown in FIGS. 3 and 5, a width of the main segment 501 is less than a width of the connection segment 502.

According to the foregoing description, the film layer structure of the connection segment 502 of the compensation line 5 is the same as the film layer structure of the touch line 4. The main segment 501 of the compensation line 5 is bent to compensate the resistance of the touch line 4, and the connection segment 502 is used to be bonded to the touch line 4, so as to receive and transmit a voltage signal to the touch line 4. Therefore, there is no need to compensate the resistance of the touch line 4 by the connection segment 502, so that the width of the connection line 502 may be approximately equal to the width of the touch line 4, and the width of the main segment 501 is less than the width of the connection segment 502.

In some embodiments, as shown in FIGS. 3 and 5, the width of the main body segment 501 of the compensation line 5 is less than the width of touch line 4, and the width of the main body segment 501 is less than the width of the connection segment 502.

In some embodiments, the width of the main segment 501 of the compensation line 5 is in a range of 2.7 μm to 4.3 μm, inclusive. For example, the width is 2.7 μm, 2.8 μm, 3.5 μm, 3.8 μm, or 4.3 μm.

The width of the connection segment 502 of the compensation line 5 is in a range of 9 μm to 17 μm, inclusive. For example, the width is 9 μm, 11 μm, 13 μm, 15 μm or 17 μm.

The width of the touch line 4 is in a range of 3.5 μm to 50 μm, inclusive. For example, the width is 3.5 μm, 20.52 μm, 26.75 μm, 40 μm or 50 μm.

In some embodiments, the touch line 4 includes a touch connection segment 40 disposed in the touch functional layer T, and a transition segment 401 disposed in the first conductive layer (for example, the first conductive layer may be the source-drain conductive layer 110). As shown in FIGS. 2 and 4, the touch connection segment 40 includes a first touch connection sub-segment 402 disposed in the first fanout region FA1, and a second touch connection sub-segment 403 disposed in the second fanout region FA2. The transition segment 401 is disposed in the bending region BA.

An end of the transition segment 401 is electrically connected to the first touch connection sub-segment 402 through a via hole disposed in an insulating layer between the first conductive layer and the touch functional layer T. Another end of the transition segment 401 is electrically connected to the second touch connection sub-section 403 through another via hole disposed in the insulating layer between the first conductive layer and the touch functional layer T.

It will be noted that, referring to FIG. 22, the insulating layer between the first conductive layer and the touch functional layer T may include one or more of the passivation layer 111, the planarization layer 112, the pixel definition layer 114, the supporting portion 115, the first inorganic encapsulation sub-layer 1171, the organic encapsulation sub-layer 1172 and the second inorganic encapsulation sub-layer 1173.

With reference to FIG. 22, it will be seen that in a thickness direction Z of display panel 100, the source-drain conductive layer 110 is an intermediate film layer of a plurality of film layers of the display panel 100, and the touch functional layer T is a film layer proximate to a surface of the display panel 100. According to the foregoing description, the display panel 100 is bent in the bending region BA, so that the second fanout region FA2 and the bonding region BD are folded onto the non-display side of the display panel 100. During the bending process of the display panel 100, a stress of the film layer proximate to the surface of the display panel 100 is relatively concentrated, and a stress of the intermediate film layer is relatively dispersed, so that a problem that the touch line 4 is broken due to stress concentration may be avoided by providing the transition segment 401, located in the bending region BA, of the touch line 4 in the source-drain conductive layer 110.

In some embodiments, with reference to FIGS. 5, 18 and 19, the touch functional layer further includes a plurality of first shielding lines G1.

As shown in FIG. 18, at least one first shielding line G1 is located between the first-side second touch line group 420 and the second-side first touch line group 411, so that the mutual influence between the voltage signals transmitted by the touch lines 4 of the first-side second touch line group 420 and the voltage signals transmitted by the touch lines 4 of the second-side first touch line group 411 is weakened, and the first shielding line G1 play a role of shielding signals.

As shown in FIGS. 5 and 19, at least one first shielding line G1 is located between the second-side second touch line group 421 and the third touch line group 43, so that the mutual influence between the voltage signals transmitted by the touch lines 4 of the second-side second touch line group 421 and the voltage signals transmitted by the touch lines 4 of the third touch line group 43 is weakened, and the first shielding line G1 play a role of shielding signals.

In some embodiments, with reference to FIGS. 16, 18 and 20, the touch functional layer further includes a plurality of second shielding lines G2.

As shown in FIG. 18, at least one second shielding line G2 is located on a side of the first-side first touch line group 410 away from the display region AA.

It will be understood that, a touch line 4 of the first-side first touch line group 410 which is farthest away from the display region AA is referred to as "an outermost touch line"; there are touch line(s) disposed on the side of each of other touch lines 4, except for the outermost touch line, of the first-side first touch line group 410 away from the display region AA. Therefore, by providing the second shielding line(s) G2 on a side of the outermost touch line away from the display region AA, and providing voltage signal(s) transmitted by the second shielding line(s) G2 to be the same as the voltage signal of the touch line 4, a working environment of the outermost touch line is substantially the same as working environments of the other touch lines 4. As a result, the outermost touch line and the other touch lines 4 are prevented from generating different voltage drops while transmitting the voltage signals.

Some embodiments of the present disclosure provide a display panel, as shown in FIG. 1, the display panel 100 includes a display region AA, and a first fanout region FA1, a bending region BA, a second fanout region FA2 and a bonding region BD that are located on a side of the display region AA and sequentially away from the display region AA; an area of the second fanout region FA2 is greater than an area of the first fanout region FA1.

It will be understood that the display panel 100 is bent in the bending region BA, so that the second fanout region A2 and the bonding region BD are folded onto a non-display side of the display panel 100; thus, the first fan out region FA1 corresponds to a bezel of the display apparatus. The area of the first fanout region FA1 is less than the area of the second fanout region FA2, it is beneficial to reduce a width of the bezel of the display apparatus corresponding to the first fanout region FA1, so that it is beneficial to narrow the bezel of the display apparatus.

As shown in FIG. 1, the display panel 100 includes a display substrate 1 and a touch functional layer T disposed in the display region AA.

The display substrate 1 includes a first power supply voltage line V1, the first power supply voltage line V1 includes a first connection portion V11 and a second connection portion V12 that are both located in the first fanout region FA1, the bending region BA and the second fanout region FA2; the first connection portion V11 and the second connection portion V12 are located on opposite sides (i.e., a first-side L and a second-side R) of a center line L1 extending in a second direction Y of the display panel 1. The second direction Y is substantially parallel to a boundary line between the first fanout region FA1 and the display region AA.

The touch functional layer T includes a plurality of touch units 3 disposed in the display region AA for realizing touch function of the display apparatus.

As shown in FIG. 1, the touch factional layer T further includes at least portion of each of a plurality of touch lines 4, and each touch unit 3 is electrically connected to at least one touch line 4. The touch line 4 is configured to transmit a voltage signal (a sensing signal) to the touch unit 3 electrically connected thereto.

For example, each touch unit 3 is electrically connected to a touch line 4, and each touch line 4 transmits a voltage signal to the touch unit 3 electrically connected thereto.

As shown in FIGS. 1 and 2, the plurality touch lines 4 extend from the display region AA to the second fanout region FA2 sequentially through the first fanout region FA1 and the bending region BA. The plurality of touch lines 4 include at least one first touch line group 41 and at least one second touch line group 42, and an average resistance of all touch lines 4 of the first touch line group 41 is greater than an average resistance of all touch lines 4 of the second touch line group 42.

For example, as shown in FIGS. 2 and 4, the plurality of touch lines 4 include first touch line groups 41 and second touch line groups 42. An average resistance of all touch lines 4 of each first touch line group 41 is greater than an average resistance of all touch lines 4 of each second touch line group 42.

As shown in FIGS. 1 and 2, all touch lines 4 of the first touch line group 41 are assembled to the binding region BD.

As shown in FIGS. 2 and 4, the touch functional layer T further includes a plurality of compensation lines 5, and the plurality of compensation lines 5 are each bent at least once in the second fanout region FA2 and assembled to the bonding region BD. The plurality of compensation lines 5 include at least one compensation line group 50 that is in one-to-one correspondence with the at least one second touch line group 42; at least one compensation line 5 of each compensation line group 50 is electrically connected to at least one touch line 4 of the respective second touch line group 42.

It will be understood that the plurality of compensation lines 5 are each bent at least once in the second fanout region FA2; thus, trace lengths of the compensation lines 5 may each be increased by bending the compensation lines 5 in a limited space, so that the resistances of the compensation lines 5 are each increased.

For example, the plurality of compensation lines 5 are each bent for a plurality of times in the second fanout region FA2, so that the trace lengths of the compensation lines 5 may each be increased.

Moreover, the average resistance of all touch lines 4 of the first touch line group 41 is greater than the average resistance of all touch lines 4 of the second touch line group 42, thus, by electrically connecting the touch lines 4 of the second touch line group 42 with the compensation lines 5, the resistances of all touch lines 4 of the second touch line group 42 may be compensated, so that the difference between the average resistance of all touch lines 4 of the second touch line group 42 with the respective compensation lines and the average resistance of all touch lines 4 of the first touch line group 41 is reduced.

For example, the plurality of compensation lines 5 include compensation line groups 50 that are in one-to-one correspondence with the second touch line groups 42, and each compensation line 5 of each compensation line group 50 is electrically connected to a touch line 4 of the respective second touch line group 42.

With reference to FIGS. 1, 2, and 4, the first touch line groups 41 and the second touch line groups 42 include one first-side first touch line group 410, two first-side second touch line groups 420, one second-side first touch line group 411, and one second-side second touch line group 421 that are sequentially disposed in the direction U which is from the first connection portion V11 to the second connection portion V12 in the first direction X.

Orthogonal projections of the first-side first touch line group 410 and the first-side second touch line groups 420 on the display substrate 1 each overlap with an orthogonal projection of the first connection portion V11 of the first power supply voltage line V1 on the display substrate 1. Orthogonal projections of the second-side first touch line group 411 and the second-side second touch line group 421 on the display substrate 1 each overlap with an orthogonal projection of the second connection portion V12 of the first power supply voltage line V1 on the display substrate 1.

It will be understood that, in the display panel 100 of the embodiments of the present disclosure, the touch lines 4 are divided into five groups of touch lines, three of which are located on the first-side L, and two of which are located on the second-side R. Two groups of touch lines 4 on the first-side L are compensated in resistance, and one group of touch lines 4 on the second-side R is compensated in resistance.

In the embodiments of the present disclosure, the average resistance of all touch lines 4 of the first touch line group 41 is greater than the average resistance of all touch lines 4 of the second touch line group 42, the plurality of compensation lines 5 are routing in a zigzag in the second fanout region FA2, and at least one compensation line 5 of each compensation line group 50 is electrically connected to at least one touch line 4 of a respective second touch line group 42, so that the average resistance of all touch lines 4 of the second touch line group 42 with the respective compensation lines may be improved, and a difference between the average resistance of all touch lines 4 of the second touch line group 42 with the respective compensation lines and the average resistance of all touch lines 4 of the first touch line group 41 is reduced. As a result, a difference value between a voltage drop (IR-Drop) generated by all touch lines 4 of the second touch line group 42 with the respective compensation lines transmitting voltage signals and a voltage drop generated by all touch lines 4 of the first touch line group 41 transmitting voltage signals is reduced. In a case where each group of touch lines 4 receives a same voltage signal, it is beneficial to improve uniformity of voltage signals received by the touch units 3 electrically connected to each group of touch lines 4.

Moreover, since the area of the second fanout region FA2 is greater than the area of the first fanout region FA1, the second fanout region FA2 provides more space for bending and routing of the compensation lines 5 than the first fanout region FA1, which is beneficial to increase the trace length of each of the compensation lines 5, and increase the resistance compensation value of each of the plurality of touch lines 4 of the second touch line group 42.

In addition, the display panel 100 is bent in the bending region BA, so that the second fanout region FA2 and the bonding region BD are folded onto the non-display side of the display panel 100. Therefore, the first fanout region FA1 is located in a bezel region of the display apparatus, and the second fanout region FA2 and the bonding region BD are not located in the bezel region of the display apparatus. Compared with that the plurality of compensation lines 5 are bent and routed in the first fanout region FA1, the plurality of compensation lines 5 being bent and routed in the second fanout region FA2 will not increase the width of the bezel of the display apparatus, so that it is beneficial to narrow the bezel of the display apparatus.

In some embodiments, as shown in FIG. 4, the plurality of touch lines 4 further include a third touch line group 43. A part of the third touch line group 43, located in the first fanout region FA1, the bending region BA and the second fanout region FA2, is farther away from the center line L1 extending in the second direction Y of the display panel 100 than the second-side second touch line group 421.

It will be understood that, with reference to FIGS. 1 and 4, the touch lines 4 of the third touch line group 43 extend to the fourth peripheral region BB4 from the third peripheral region BB3 through the second peripheral region BB2. By means of the above-mentioned layout design of the third touch line group 43, any intersection between the touch lines 4 of third touch line group 43 and the touch lines 4 in the at least one second-side second touch line group 421 may be avoided.

In some embodiments, as shown in FIGS. 1, 2 and 4, the display panel 10 further includes a plurality of pin groups 6, and the plurality of pin groups 6 are disposed in the bonding region BD. The plurality of pin groups 6 include a first pin group 61, a second pin group 62, a third pin group 63, a fourth pin group 64, a fifth pin group 65, a sixth pin group 66 and a seventh pin group 67 that are sequentially disposed in the direction U which is pointed from the first connection portion V11 to the second connection portion V12 in the first direction X. Each pin group 6 includes at least one pin 60.

Each touch line 4 of the first-side first touch line group 411 is electrically connected to at least one pin 60 of the first pin group 61. Each compensation line 5 of a compensation line group 50 corresponding to one of the two first-side second touch line groups 420 is electrically connected to at least one pin 60 of the second pin group 62, and each compensation line 5 of a compensation line group 50 corresponding to another of the two first-side second touch line groups 420 is electrically connected to at least one pin 60 of the third pin group 63. The first power supply voltage line 111 is electrically connected to at least one pin 60 of the fourth pin group 64. Each touch line 4 of the second-side first touch line group 411 is electrically connected to at least one pin 60 of the fifth pin group 65. Each compensation line 5 of a compensation line group 50 corresponding to the second-side second touch line group 421 is electrically connected to at least one pin 60 of the sixth pin group 66. Each touch line 4 of the third touch line group 43 is electrically connected to at least one pin 60 of the seventh pin group 67.

The plurality of pin groups 6 are bonded to a flexible printed circuit (FPC) board, so as to receive voltage signals from the flexible printed circuit board.

In addition, in technology of On Cell, the touch functional layer T is directly disposed on the encapsulation layer 117 of the display substrate 1 by a process of a flexible single-layer on cell (FSLOC) technology. The FSLOC technology may be based on a working principle of self-capacitance (or voltage) detection, and generally provides a single layer of metal to form touch electrodes. When a finger touches the display apparatus, the finger will carry away charges on the touch unit, and the touch IC recognizes a touch position of the finger by detecting a change in a self-capacitance value (or voltage value) of touch electrodes, so that the touch control function of the display apparatus is realized.

Some embodiments of the present disclosure further provide a display panel, which adopts the FSLOC technology. A routing manner of the display panel in a fanout region also adopts a routing manner shown in FIG. 1, so as to provide more bending and routing space for the compensation lines, which is beneficial to increase the trace length of each of the compensation lines, increase the resistance compensation value for the respective touch lines, and improve uniformity of voltage signals received by the touch units electrically connected with the touch lines. Furthermore, the width of the bezel of the display apparatus will not be increased, so that it is beneficial to narrow the bezel of the display apparatus.

Figure 29:
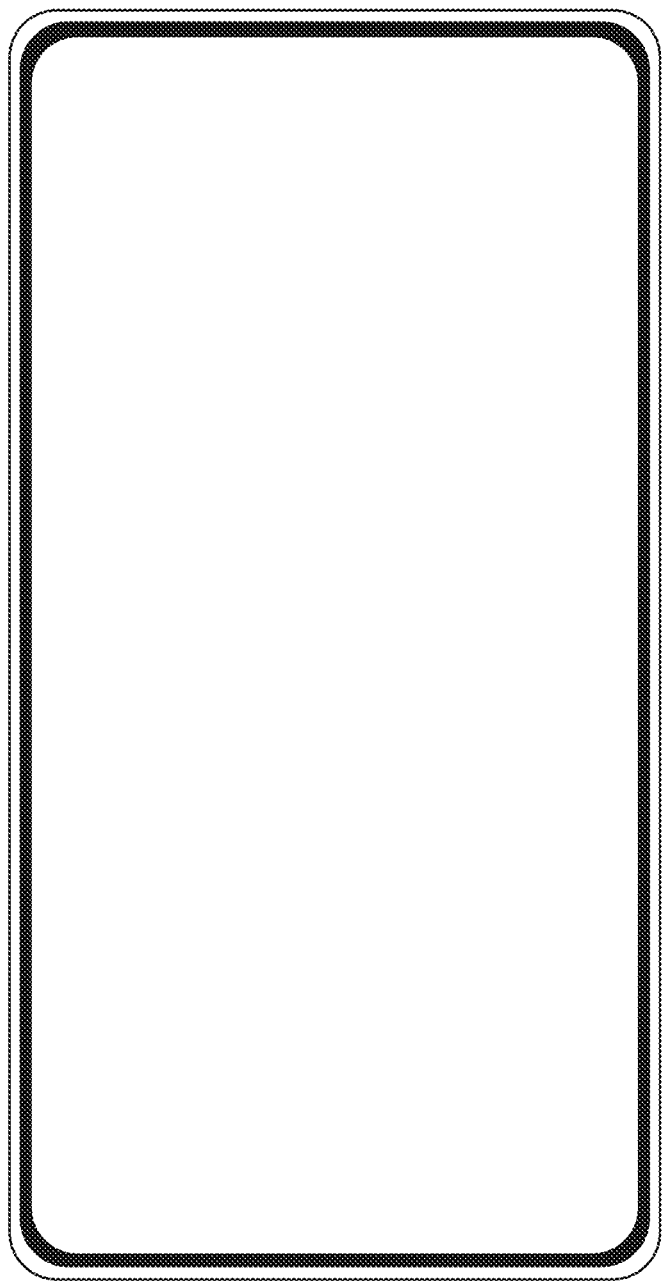
FIG. 29 is a top view of a display apparatus, in accordance with some embodiments.

Some embodiments of the present disclosure further provide a display apparatus 300, as shown in FIG. 29, the display apparatus 300 includes the display panel 100 in any of the above embodiments.

In the above-mentioned embodiment of the present disclosure, the display panel 100 of the display apparatus 300 may improve the uniformity of the voltage signals received by the touch units 3 electrically connected to each group of the touch lines 4.

Moreover, since the area of the second fanout region FA2 is greater than the area of the first fanout region FA1, the second fanout region FA2 provides more space for bending and routing of the compensation lines 5 than the first fanout region FA1, which is beneficial to increase the trace length of each of the compensation lines 5, and increase the resistance compensation values for the respective touch lines 4 of the second touch line group 42.

In addition, the width of the bezel of the display apparatus will not be increased, so that it is beneficial to narrow the bezel of the display apparatus.

The display apparatus 300 may be an electroluminescent display apparatus, and the electroluminescent display apparatus may be an organic light-emitting diode (OLED) display apparatus or a quantum dot light-emitting diode (QLED) display apparatus.

The display apparatus 300 may be any apparatus that displays an image whether in motion (e.g., a video) or stationary (e.g., a static image), and whether textual or graphical. More specifically, it is anticipated that the embodiments may be implemented in a variety of electronic apparatuses or associated with a variety of electronic apparatuses. The variety of electronic apparatuses include (but are not limited to): mobile phones, wireless apparatuses, personal data assistants (PDAs), hand-held or portable computers, GPS receivers/navigators, cameras, MP4 video players, video cameras, game consoles, watches, clocks, calculators, television monitors, flat panel displays, computer monitors, automobile displays (e.g., odometer displays, etc.), navigators, cockpit controllers and/or displays, displays of camera views (e.g., displays of rear-view cameras in vehicles), electronic photos, electronic billboards or signs, projectors, building structures, packaging and aesthetic structures (e.g., displays for displaying an image of a piece of jewelry), etc.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the scope of the present disclosure shall be subject to the protection scope of the claims.

What is claimed is:

1. A display panel having a display region, and a bending region and a bonding region that are located on a side of the display region and sequentially away from the display region, the display panel comprising:
    a display substrate;
    a touch functional layer disposed on the display substrate, including:
        a plurality of touch units disposed in the display region;
        at least portion of each of a plurality of touch lines, each touch unit being electrically connected to at least one touch line;
        wherein the plurality of touch lines extend from the display region through the bending region to a side of the bending region away from the display region;
        the plurality of touch lines includes at least one first touch line and at least one second touch line, and a resistance of the at least one first touch line is greater than a resistance of the at least one second touch line; and
    a plurality of compensation lines, at least part of compensation lines of the plurality of compensation lines being disposed on the side of the bending region away from the display region;
    wherein a second touch line is electrically connected to at least one compensation line.

2. The display panel according to claim 1, further having a first fanout region located between the display region and the bending region, and a second fanout region located between the bending region and the bonding region, an area of the second fanout region being greater than an area of the first fanout region;
    wherein the compensation lines disposed on the side of the bending region away from the display region are each bent at least once in the second fanout region, and are assembled to the bonding region.

3. The display panel according to claim 1, wherein the plurality of touch lines include at least one first touch line group and at least one second touch line group, and an average resistance of one or more touch lines of the at least one first touch line group is greater than an average resistance of one or more touch lines of the at least one second touch line group;
    the plurality of compensation lines include at least one compensation line group that is in one-to-one correspondence with the at least one second touch line group, and at least one compensation line of each compensation line group is electrically connected to at least one touch line of a respective second touch line group;
    a touch line of the at least one second touch line group and a compensation line electrically connected thereto provide a compensation touch line; and
    an average resistance of one or more compensation touch lines in the at least one second touch line group and the respective compensation line group is substantially equal to the average resistance of one or more touch lines of one or more of the at least one first touch line group.

4. The display panel according to claim 3, wherein a resistance of the compensation touch line is approximately equal to a resistance of at least one touch line of the at least one first touch line group; and/or
    a resistance of each compensation touch line in the at least one second touch line group and the respective compensation line group is approximately the same; and/or
    an average length of the one or more touch lines of the at least one second touch line group is less than an average length of the one or more touch lines of the at least one first touch line group.

5. The display panel according to claim 1, further having a first fanout region located between the display region and the bending region, and a second fanout region located between the bending region and the bonding region;
    wherein the display substrate includes:
        a substrate; and
        a first conductive layer disposed on the substrate and including a first power supply voltage line;
        the first power supply voltage line extends from the first fanout region to the bonding region sequentially through the bending region and the second fanout region;
        wherein the plurality of touch lines each include a touch connection segment located in the first fanout region and the second fanout region, and an orthogonal projection of the touch connection segment on the substrate at least partially overlaps with an orthogonal projection of the first power supply voltage line on the substrate; and
    orthogonal projections of the plurality of compensation lines on the substrate at least partially overlap with the orthogonal projection of the first power supply voltage line on the substrate.

6. The display panel according to claim 5, wherein orthogonal projections of one or more compensation lines on the substrate are within the orthogonal projection of the first power supply voltage line on the substrate; and/or
    the first conductive layer further includes a second power supply voltage line, the second power supply voltage line extends from the first fanout region to the bonding region sequentially through the bending region and the second fanout region;
    orthogonal projections of another one or more compensation lines on the substrate partially overlap with the orthogonal projection of the first power supply voltage line on the substrate and partially overlap with an orthogonal projection of the second power supply voltage line on the substrate.

7. The display panel according to claim 5, wherein the first power supply voltage line includes a first connection portion located in the first fanout region, the bending region and the second fanout region, the first connection portion is located on a first-side of a center line extending in a second direction of the display panel;
    the second direction is substantially perpendicular to a boundary line between the first fanout region and the display region;
    touch lines to which touch connection segments, whose orthogonal projections on the substrate located within the orthogonal projection of the first connection portion on the substrate, belong include at least one first-side first touch line group and N first-side second touch line groups, N is a number greater than or equal to 2;
    from a first first-side second touch line group to a N-th first-side second touch line group, average resistances of all touch lines of each first-side second touch line group are sequentially reduced;

the plurality of compensation lines include N compensation line groups corresponding to the N first-side second touch line groups, an i-th first-side second touch line group is electrically connected to an i-th compensation line group, i is a number in a range of 1 to N, inclusive;

average resistances of all compensation lines of each compensation line group from a first compensation line group to an N-th compensation line group are sequentially increased.

8. The display panel according to claim 7, wherein the at least one first-side first touch line group and the N first-side second touch line groups are sequentially disposed in a first direction, and the N first-side second touch line groups are closer to the center line than the at least one first-side first touch line group;

the first direction is substantially parallel to the boundary line between the first fanout region and the display region;

the N compensation line groups are all located on a side of the at least one first-side first touch line group proximate to the center line.

9. The display panel according to claim 8, wherein the first conductive layer further includes a second power supply voltage line, the second power supply voltage line is located on a side of the first connection portion proximate to the center line;

the N compensation line groups include at least one first target compensation line group and at least one second target compensation line group;

an orthogonal projection of the first target compensation line group on the substrate is located within the orthogonal projection of the first connection portion on the substrate;

an orthogonal projection of the second target compensation line group on the substrate partially overlaps with the orthogonal projection of the first connection portion on the substrate, and partially overlaps with the orthogonal projection of the second power supply voltage line on the substrate; or the first conductive layer further includes a second power supply voltage line located on a side of the first connection portion proximate to the center line;

the N compensation line groups include at least one first target compensation line group and at least one second target compensation line group;

an orthogonal projection of the first target compensation line group on the substrate is located within the orthogonal projection of the first connection portion on the substrate;

an orthogonal projection of the second target compensation line group on the substrate partially overlaps with the orthogonal projection of the first connection portion on the substrate, and partially overlaps with the orthogonal projection of the second power supply voltage line on the substrate;

a first-side second touch line group corresponding to a second target compensation line group is located on a side of a first-side second touch line group corresponding to a first target compensation line group proximate to the center line.

10. The display panel according to claim 7, wherein the plurality of touch units include first touch units;

each first touch unit extends in a first direction, and the first touch units are arranged side by side in the second direction;

the first direction is substantially parallel to a boundary line between the first fanout region and the display region;

the first touch units are divided into a plurality of groups of first touch units, each group of first touch units includes one or more first touch units adjacent in the second direction;

the plurality of groups of first touch units are in one-to-one correspondence with the at least one first-side first touch line group and the N first-side second touch line groups;

at least one touch line of each first-side first touch line group and at least one touch line of each first-side second touch line group are respectively electrically connected to at least one first touch unit in a respective group of first touch units;

in the second direction, at least one group of first touch units corresponding to the at least one first-side first touch line group, and N groups of first touch units corresponding to from the first first-side second touch line group to the N-th first-side second touch line group are sequentially approach to the first fanout region.

11. The display panel according to claim 5, wherein the first power supply voltage line includes a second connection portion located in the first fanout region, the bending region and the second fanout region, and the second connection portion is located on a second-side of a center line extending in a second direction of the display panel;

touch lines to which touch connection segments, whose orthogonal projections on the substrate located within an orthogonal projection of the second connection portion on the substrate, belong include at least one second-side first touch line group and at least one second-side second touch line group sequentially disposed in a first direction, and the at least one second-side first touch line group is closer to the center line than the at least one second-side second touch line group;

the first direction is substantially parallel to a boundary line between the first fanout region and the display region, and the second direction is substantially perpendicular to the first direction;

the plurality of compensation lines include at least one compensation line group corresponding to the at least one second-side second touch line group, an orthogonal projection of the at least one compensation line group on the substrate is within the orthogonal projection of the second connection portion on the substrate.

12. The display panel according to claim 11, wherein the plurality of touch units include second touch units;

each second touch unit extends in the second direction, and the second touch units are arranged side by side in the first direction;

the plurality of second touch units are divided into a plurality of groups of second touch units, each group includes one or more second touch units adjacent in the first direction, and the plurality of groups of second touch units are in one-to-one correspondence with the at least one second-side first touch line group and the at least one second-side second touch line group;

at least one touch line of each second-side first touch line group and at least one touch line of each second-side second touch line group are respectively electrically connected to at least one second touch unit of a respective second touch unit group;

in a direction which is from the center line to the second connection portion in the first direction, at least one second touch unit group corresponding to the at least one second-side first touch line group, and at least one second touch unit group corresponding to the at least one second-side second touch line group are sequentially disposed.

13. The display panel according to claim 12, wherein the display panel further has a third peripheral region and a fourth peripheral region on opposite sides of the display region in the second direction, and the first fanout region, the bending region, the second fanout region and the bonding region are located in the fourth peripheral region;
  touch lines of the at least one second-side first touch line group and the at least one second-side second touch line group are all located in the fourth peripheral region; or
  the display panel further has a third peripheral region and a fourth peripheral region on opposite sides of the display region in the second direction, and a first peripheral region and a second peripheral region on opposite sides of the display region in the first direction;
  the first fanout region, the bending region, the second fanout region and the bonding region are located in the fourth peripheral region;
  the plurality of touch lines further includes a third touch line group, at least one touch line of the third touch line group is electrically connected to at least one second touch unit, and is assembled to the bonding region from the third peripheral region sequentially through the second peripheral region, the first fanout region, the bending region and the second fanout region;
  orthogonal projections of portions, located in the first fanout region and the second fanout region, of the at least one touch line of the third touch line group are located within the orthogonal projection of the first power supply voltage line on the substrate; and
  part of the third touch line group located in the fourth peripheral region is farther away from the center line than the at least one second-side second touch line group.

14. The display panel according to claim 1, wherein the touch functional layer includes an electrode layer, a first insulating layer and a bridging layer that are stacked on the display substrate, the first insulating layer is located between the electrode layer and the bridging layer, and the bridging layer is located on a side of the electrode layer proximate to or away from the display substrate;
  the plurality of touch units include a plurality of first touch units and a plurality of second touch units that are insulated from each other;
  each first touch unit extends in a first direction and includes a plurality of first touch electrodes and a plurality of first connection bridges, and two adjacent first touch electrodes are electrically connected to each other through a first connection bridge;
  the plurality of first touch units are arranged side by side in a second direction;
  each second touch unit extends in the second direction and includes a plurality of second touch electrodes and a plurality of second connection bridges, and two adjacent second touch electrodes are electrically connected to each other through a second connection bridge;
  the plurality of second touch units are arranged side by side in the first direction;
  wherein the first touch electrodes, the first connection bridges and the second touch electrodes are disposed in the electrode layer, and the second connection bridges are disposed in the bridging layer; or
  the first touch electrodes, the second touch electrodes and the second connection bridges are disposed in the electrode layer, and the first connection bridges are disposed in the bridging layer.

15. The display panel according to claim 14, wherein the second touch line located includes a first touch sub-line located in the electrode layer and a second touch sub-line located in the bridging layer, and the first touch sub-line and the second touch sub-line are electrically connected to each other through at least one via hole provided in the first insulating layer; and
  the compensation line is disposed in the electrode layer, and is directly electrically connected to the first touch sub-line of the second touch line; or
  the compensation line is disposed in the bridging layer, and is directly electrically connected to the second touch sub-line of the second touch line; or
  the compensation line includes a first compensation sub-line disposed in the electrode layer and a second compensation sub-line disposed in the bridging layer, the first compensation sub-line is directly electrically connected to the first touch sub-line of the second touch line, and the second compensation sub-line is directly electrically connected to the second touch sub-line of the second touch line group; or
  the compensation line includes a first compensation sub-line disposed in the electrode layer and a second compensation sub-line disposed in the bridging layer, the first compensation sub-line is directly electrically connected to the first touch sub-line of the second touch line, and the second compensation sub-line is directly electrically connected to the second touch sub-line of the second touch line group;
  the first compensation sub-line and the second compensation sub-line are electrically connected to each other through at least one via hole provided in the first insulating layer.

16. The display panel according to claim 1, wherein the compensation line is in a broken line shape and includes a plurality of broken line segments, at least one broken line segment extends in a first direction or a second direction;
  the first direction intersects the second direction; and/or
  the compensation line includes a main segment and a connection segment;
  an end of the main segment is electrically connected to a corresponding touch line, and another end of the main segment after being bent at least once is electrically connected to an end of the connection segment;
  another end of the connection segment away from the main segment extends to the bonding region;
  a width of the main segment is less than a width of the corresponding touch line, and/or less than a width of the connection segment.

17. The display panel according to claim 1, wherein the display substrate includes a first conductive layer;
  each touch line includes a touch connection segment disposed in the touch functional layer and a transition segment disposed in the first conductive layer;
  the touch connection segment includes a first touch connection sub-segment disposed in the first fanout region and a second touch connection sub-segment disposed in the second fanout region;
  the transition segment is disposed in the bending region;
  an end of the transition segment is electrically connected to the first touch connection sub-segment through a via hole provided in an insulating layer between the first conductive layer and the touch functional layer, and another end of the transition segment is electrically connected to the second touch connection sub-segment through another via hole provided in the insulating layer between the first conductive layer and the touch functional layer.

18. A display apparatus, comprising the display panel according to claim 1.

19. A display panel, having a display region, and a first fanout region, a bending region, a second fanout region and a bonding region located on a side of the display region and sequentially away from the display region; and an area of the second fanout region is greater than an area of the first fanout region;

the display panel comprising:
a display substrate, including:
a first power supply voltage line including a first connection portion and a second connection portion that are both located in the first fanout region, the bending region and the second fanout region;
the first connection portion and the second connection portion are respectively located on opposite sides of a center line extending in a second direction of the display panel; and
a touch functional layer disposed on the display substrate and including:
a plurality of touch units disposed in the display region;
at least portion of each of a plurality of touch lines, each touch unit being electrically connected to at least one touch line;
wherein the plurality of touch lines extend from the display region to the second fanout region sequentially through the first fanout region and the bending region;
the plurality of touch lines include first touch line groups and second touch line groups, and an average resistance of all touch lines of a first touch line group is greater than an average resistance of all touch lines of a second touch line group; and
all the touch lines of the first touch line group are assembled to the bonding region; and
a plurality of compensation lines each bent at least once in the second fanout region and assembled to the bonding region;
wherein the plurality of compensation lines include compensation line groups that are in one-to-one correspondence with the second touch line groups, at least one compensation line of each compensation line group is electrically connected to at least one touch line of a respective second touch line group;
wherein the first touch line groups and the second touch line groups include:
one first-side first touch line group, two first-side second touch line groups, one second-side first touch line group and one second-side second touch line group that are sequentially disposed in a direction which is from the first connection portion to the second connection portion in a first direction;

orthogonal projections of the first-side first touch line group and the first-side second touch line groups on the display substrate each overlap with an orthogonal projection of the first connection portion of the first power supply voltage line on the display substrate; and orthogonal projections of the second-side first touch-control line group and the second-side second touch line group on the display substrate each overlap with an orthogonal projection of the second connection portion of the first power supply voltage line on the display substrate;

the first direction is substantially parallel to a boundary line between the first fanout region and the display region, and the second direction is substantially perpendicular to the first direction.

20. The display panel according to claim 19, wherein the plurality of touch lines further include a third touch line group, and part of the third touch line group located in the first fanout region, the bending region and the second fanout region is farther away from the center line than the second-side second touch line groups; or
wherein the plurality of touch lines further include a third touch line group, and part of the third touch line group located in the first fanout region, the bending region and the second fanout region is farther away from the center line than the second-side second touch line groups;

the display panel further comprises:
a plurality of pin groups disposed in the bonding region and including a first pin group, a second pin group, a third pin group, a fourth pin group, a fifth pin group, a sixth pin group and a seventh pin group that are sequentially disposed in the direction from the first connection portion to the second connection portion in the first direction, and each pin group including at least one pin;
wherein each touch line of the first-side first touch line group is electrically connected to at least one pin of the first pin group; each compensation line of a compensation line group corresponding to one of the two first-side second touch line groups is electrically connected to at least one pin of the second pin group;
each compensation line of a compensation line group corresponding to another of the two first-side second touch line groups is electrically connected to at least one pin of the third pin group;
the first power supply voltage line is electrically connected to at least one pin of the fourth pin group;
each touch line of the second-side first touch line group is electrically connected to at least one pin of the fifth pin group;
each compensation line of a compensation line group corresponding to the second-side second touch line group is electrically connected to at least one pin of the sixth pin group; and
each touch line of the third touch line is electrically connected to at least one pin of the seventh pin group.

* * * * *